(12) United States Patent
Nishimura et al.

(10) Patent No.: US 7,935,548 B2
(45) Date of Patent: May 3, 2011

(54) DEPOSITION APPARATUS AND DEPOSITION METHOD

(75) Inventors: Kazuhito Nishimura, Nankoku (JP); Hideki Sasaoka, Kochi (JP)

(73) Assignees: Kochi Industrial Promotion Center, Kochi-shi (JP); Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/334,832

(22) Filed: Dec. 15, 2008

(65) Prior Publication Data

US 2009/0155934 A1 Jun. 18, 2009

(30) Foreign Application Priority Data

Dec. 17, 2007 (JP) ................... 2007-325303

(51) Int. Cl.
*H01L 21/66* (2006.01)
*H01L 21/62* (2006.01)
(52) U.S. Cl. ..... 438/14; 438/105; 438/680; 257/E21.52; 257/E21.521
(58) Field of Classification Search ............ 438/14, 438/105, 680
See application file for complete search history.

(56) References Cited

U.S. PATENT DOCUMENTS

| 6,631,692 | B1 | 10/2003 | Matsuki et al. |
| 2006/0021705 | A1* | 2/2006 | Imai et al. ............... 156/345.52 |

FOREIGN PATENT DOCUMENTS

| CN | 101016624 A | 8/2007 |
| JP | 2007-053359 A | 3/2007 |

OTHER PUBLICATIONS

Chinese Office Action dated Apr. 27, 2010 (11 pages), and English translation thereof (8 pages), issued in counterpart Chinese Application Serial No. 200810185644.7.
Chinese Office Action dated Dec. 16, 2010 (and English translation thereof) in counterpart Chinese Application No. 200810185644.7.

* cited by examiner

*Primary Examiner* — Alexander G Ghyka
(74) *Attorney, Agent, or Firm* — Holtz, Holtz, Goodman & Chick, PC

(57) ABSTRACT

A deposition apparatus includes: a first electrode for placing a processing object; a second electrode for generating plasma with the first electrode, the second electrode being opposed to the first electrode; and a heat flow control heat transfer part for drawing heat from the processing object to generate a heat flow from a central area to a peripheral area of the processing object.

12 Claims, 27 Drawing Sheets

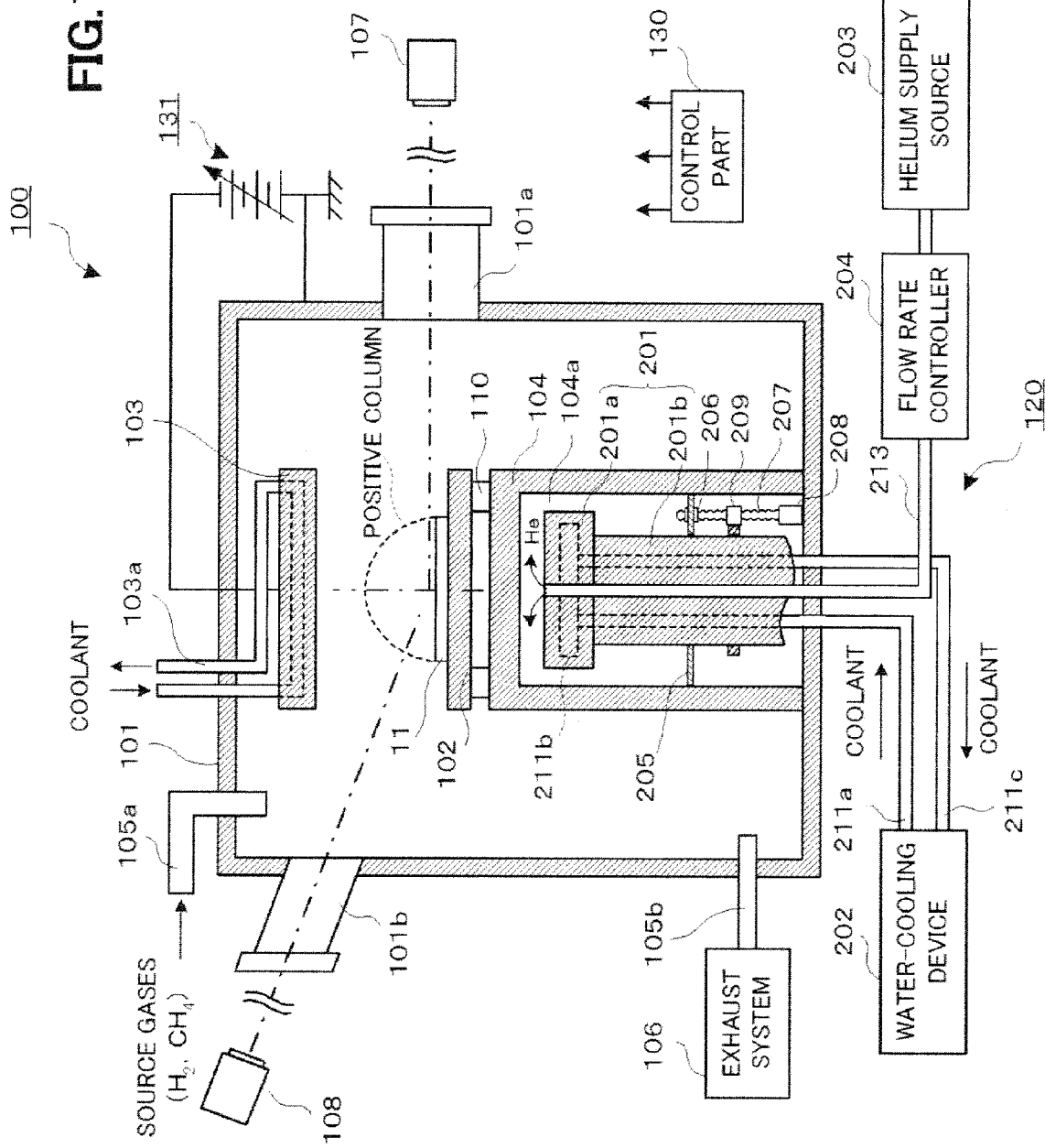

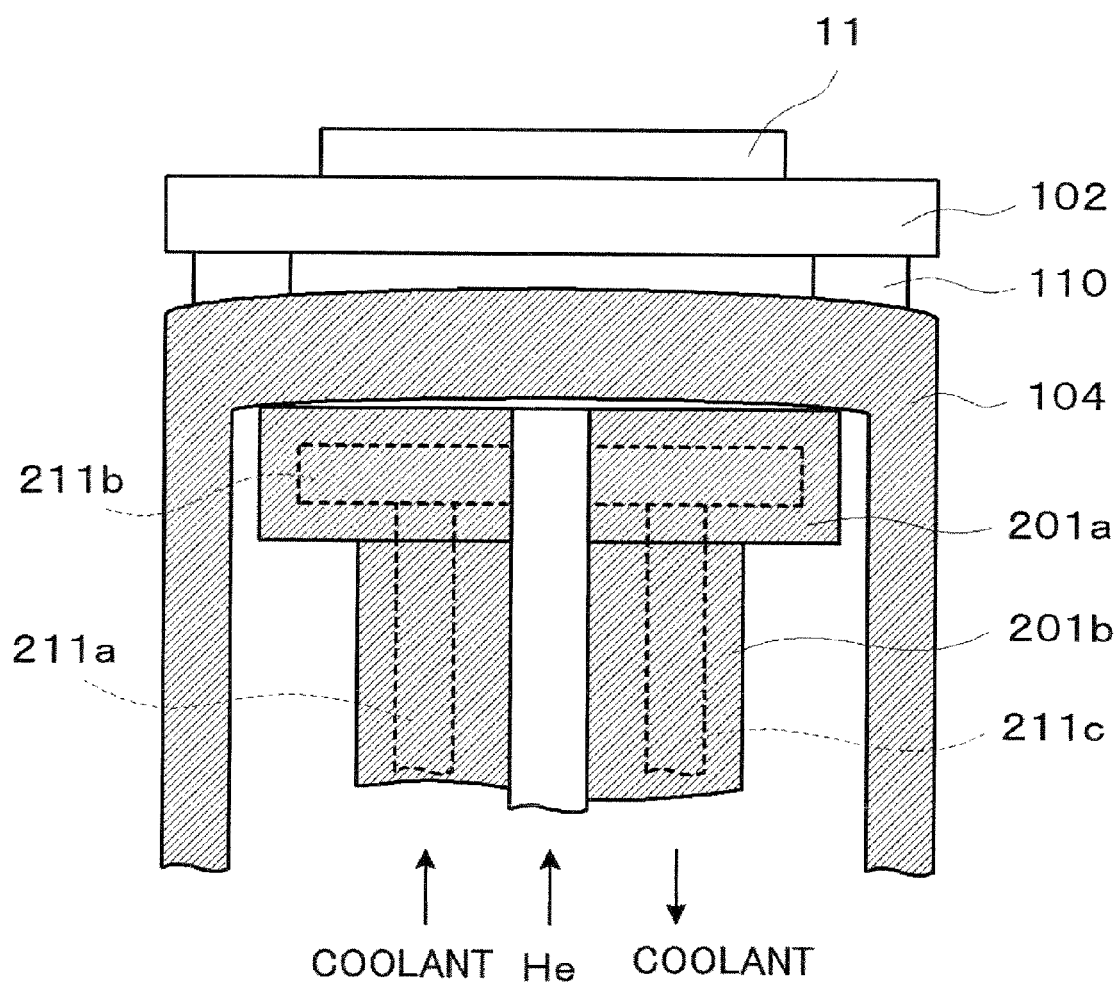

| DEPOSITION TIME | MEASUREMENT POINT A | MEASUREMENT POINT B |
|---|---|---|
| AFTER ELAPSE OF 4 HOURS (ON COMPLETION OF ND/CNW FILM DEPOSITION) | 980°C | 963 °C |

| DEPOSITION TIME | MEASUREMENT POINT A | MEASUREMENT POINT B |
|---|---|---|
| AFTER ELAPSE OF 4 HOURS (ON COMPLETION OF ND/CNW FILM DEPOSITION) | 980°C | 952°C |

DEPOSITION APPARATUS AND DEPOSITION METHOD

BACKGROUND OF THE INVENTION

1. Field of the Invention

The present invention relates to a deposition apparatus and a deposition method.

2. Description of the Related Art

Diamond deposition with use of a plasma CVD (Chemical Vapor Deposition) method has conventionally been performed. In such diamond deposition, a gas mixture of hydrogen and methane is used as a source gas to deposit a polycrystalline diamond film having a crystalline size of the order of micrometers (hereinafter referred to as an MD film).

In recent years, in the diamond deposition using the gas mixture of hydrogen and methane, a tendency for the crystalline size to rapidly decrease by setting a ratio of methane to 5% or more has been used to form a diamond film having a crystalline size of the order of nanometers (hereinafter referred to as an ND film). Such ND film having a crystalline size of the order of nanometers is smoother than the MD film, and therefore expected to be optically applied.

Also, in plasma CVD apparatus in semiconductor manufacturing, to improve uniformity of deposition, an electrode shape is changed to thereby control an active species density distribution and gas and electron temperatures in plasma, as disclosed in, for example, Unexamined Japanese Patent Application KOKAI Publication No. 2007-53359.

However, in the plasma CVD, if the electrode is formed in a complicated shape to achieve the uniformity of the deposition, electric field concentration is likely to occur in the vicinity of the electrode where electric field intensity is increased, and therefore some problems arise, for example, stable glow discharge required for the deposition is disturbed, and corona discharge or arc discharge is likely to occur.

Meanwhile, the present inventors have been advancing the development of a device material having excellent electron emission characteristics by depositing the nanodiamond film on an aggregate of a graphene sheet structure.

If, upon deposition of such ND film, the methane ratio in an atmosphere inside deposition apparatus is increased, a positive column (a region where a number of active species are included, and a substrate is typically placed so as to be exposed to the positive column) tends to shrink. For this reason, even in the case of the deposition with the same power, a local deposition rate is increased, but the uniformity of the deposition tends to be disturbed.

It is known that, upon deposition of the MD film, $CH_3$ radicals known as a direct material for MD growth can diffuse in plasma because lifetimes of them in the plasma are relatively long, and are therefore uniformly distributed as compared with a density distribution, electron temperature distribution, and gas temperature distribution, of the other active species.

However, high chemical potential active species (C, $C_2$, CH, or $C_xH_y$), which are to serve as material radicals for ND film growth, are rapidly decreased in density in a region where electron or gas temperatures is low. From this, it is considered that, in the ND film, an area where electron emission characteristics with respect to plasma expansion are uniform and the deposition is uniformly performed tends to be narrow as compared with the MD film.

Also, in an electron emission device using the ND film, electrical characteristics of a deposition surface are very sensitive to variations in substrate temperature and active species density in a deposition process, and therefore the electrical characteristics are likely to be influenced by variation in active species density distribution as described above. For this reason, in the deposition for the ND electron emission device, a deposition area where electrons can uniformly be emitted with respect to an applied voltage is smaller than an electrode area, and therefore in-plane uniformity becomes poor. Accordingly, there arises a problem that it is difficult to obtain the electron emission film capable of emitting electrons from the entire surface deposited on a substrate.

The present invention has been made in consideration of the above-described actual situations, and has an advantage of providing deposition apparatus and deposition method that are capable of forming a film having good uniformity in in-plane electrical characteristics.

SUMMARY OF THE INVENTION

In order to accomplish the above object, a deposition apparatus according to a first aspect of the present invention comprises:

a first electrode for placing a processing object;

a second electrode for generating plasma with the first electrode, the second electrode being opposed to the first electrode; and a heat flow control heat transfer part for drawing heat from the processing object to generate a heat flow from a central area to a peripheral area of the processing object.

The heat flow control heat transfer part may be installed between a placing stage for placing the first electrode and the first electrode, or a part of the placing stage for placing the first electrode.

The heat flow control heat transfer part may be opposed to at least a part of the peripheral area of the processing object via the first electrode.

The heat flow control heat transfer part may be of a hollow ring-like shape.

The heat flow control heat transfer part may include molybdenum.

The heat flow control heat transfer part may comprise:

a first area formed of a material having a first thermal conductivity; and a second area formed of a material having a second thermal conductivity higher than the first thermal conductivity, the first area being formed in a central area of the heat flow control heat transfer part, and the second area being formed in a peripheral area of the heat flow control heat transfer part.

The heat flow control heat transfer part may be of a disk-like shape.

The deposition apparatus may further comprise a cooling system for cooling the placing stage by coming close to or into abutting contact with the placing stage for placing the first electrode.

The deposition apparatus may further comprise a cooling system transfer mechanism for transferring the cooling system to/from a face of the placing stage, the face of the placing stage being opposed to a face of the placing stage for placing the first electrode.

A nanocrystalline diamond film may be formed on the processing object.

A carbon nanowall having a graphene sheet under the nanocrystalline diamond film may be formed.

A protrusion made of graphite may be further formed so as to protrude on the nanocrystalline diamond film.

The deposition apparatus may further comprise a temperature measurement part for measuring a temperature of the processing object.

In order to accomplish the above object, a deposition apparatus according to a second aspect of the present invention comprises:

a first electrode for placing a processing object;

a placing stage for placing the first electrode;

a second electrode for generating plasma with the first electrode, the second electrode being opposed to the first electrode; and a heat flow control heat transfer part for differentiating a thermal resistance between a first area of the processing object where a density of active species contributing to deposition by the plasma is high and the placing stage from a thermal resistance between a second area where a density of the active species contributing to the deposition is lower than that in the first area and the placing stage to control a temperature distribution within a substrate surface.

In order to accomplish the above object, deposition apparatus according to a third aspect of the present invention comprises:

a first electrode for placing a processing object;

a placing stage for placing the first electrode;

a second electrode for generating plasma with the first electrode, the second electrode being opposed to the first electrode; and a heat flow control heat transfer part for, in order to attain a uniform film property between a first area of the processing object where a density of active species contributing to deposition by the plasma is high and a second area where a density of the active species contributing to the deposition is lower than that in the first area, decreasing a thermal resistance from the second area of the processing object to the placing stage as compared with a thermal resistance from the first area to the placing stage.

In order to accomplish the above object, a deposition method according to a fourth aspect of the present invention comprises:

a step of placing a processing object on a first electrode; and a deposition step of generating plasma between the first electrode and a second electrode to deposit a film on a surface of the processing object with a heat flow being generated from a central area to a peripheral area of the processing object by a heat flow control heat transfer part.

The heat flow control heat transfer part may be installed between a placing stage for placing the first electrode and the first electrode, or a part of the placing stage for placing the first electrode.

The heat flow control heat transfer part may be opposed to at least a part of the peripheral area of the processing object via the first electrode.

The heat flow control heat transfer part may be of a hollow ring-like shape.

The heat flow control heat transfer part may comprise:

a first area formed of a material having a first thermal conductivity; and a second area formed of a material having a second thermal conductivity higher than the first thermal conductivity, the first area being formed in a central area of the heat flow control heat transfer part, and the second area being formed in a peripheral area of the heat flow controlling heat.

The heat flow control heat transfer part may be of a disk-like shape.

The heat flow control heat transfer part may cool the processing object via the first electrode by being cooled by a cooling system for cooling a placing stage for placing the first electrode, the cooling system intervening between the first electrode and the placing stage.

In the deposition step, a nanocrystalline diamond film may be formed on the processing object.

A carbon nanowall having a graphene sheet under the nanocrystalline diamond film may be formed.

A protrusion made of graphite may be further formed so as to protrude on the nanocrystalline diamond film.

The deposition method may further comprise a temperature measurement step of measuring a temperature of the processing object.

The heat flow control heat transfer part may include molybdenum.

There can be provided the deposition apparatus and deposition method that are capable of forming a film having good in-plane uniformity by the heat flow control heat transfer part providing a temperature gradient appropriate for the deposition within a substrate.

BRIEF DESCRIPTION OF THE DRAWINGS

These objects and other objects and advantages of the present invention will become more apparent upon reading of the following detailed description and the accompanying drawings prepared exclusively for explanation and by no means intended to limit the scope of the present invention, in which:

FIG. 1 is a diagram schematically illustrating an example configuration of deposition apparatus of an embodiment of the present invention.

FIG. 4 is a diagram illustrating a state where a cooling part of the cooling stage in the embodiment of the present invention is brought into abutting contact with a stage.

DETAILED DESCRIPTION OF THE PREFERRED EMBODIMENTS

Figure 2A:
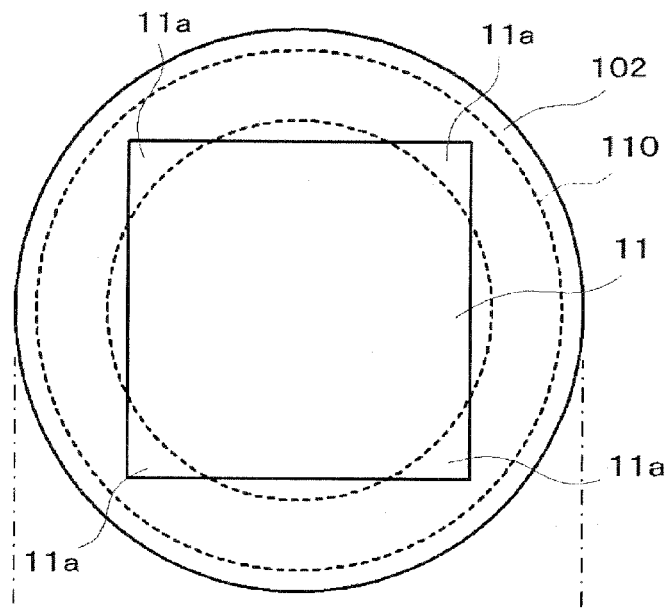
FIG. 2A is a plan view illustrating an example configuration of a heat flow control heat transfer part of the deposition apparatus in the embodiment of the present invention.

Deposition apparatus and deposition method according to an embodiment of the present invention are described with use of the drawings.

A example configuration of the deposition apparatus 100 according to the embodiment of the present invention is illustrated in FIGS. 1 to 4. The deposition apparatus 100 comprises, as illustrated in FIG. 1, a chamber 101, anode 102, cathode 103, stage (placing stage) 104, exhaust system 106, spectral luminance meters 107 and 108, heat flow control heat transfer part 110, cooling system 120, control part 130, and variable power supply 131. Also, the cooling system 120 comprises a cooling part 201, water-cooling device 202, helium supply source 203, and flow rate controller 204.

Figure 5:
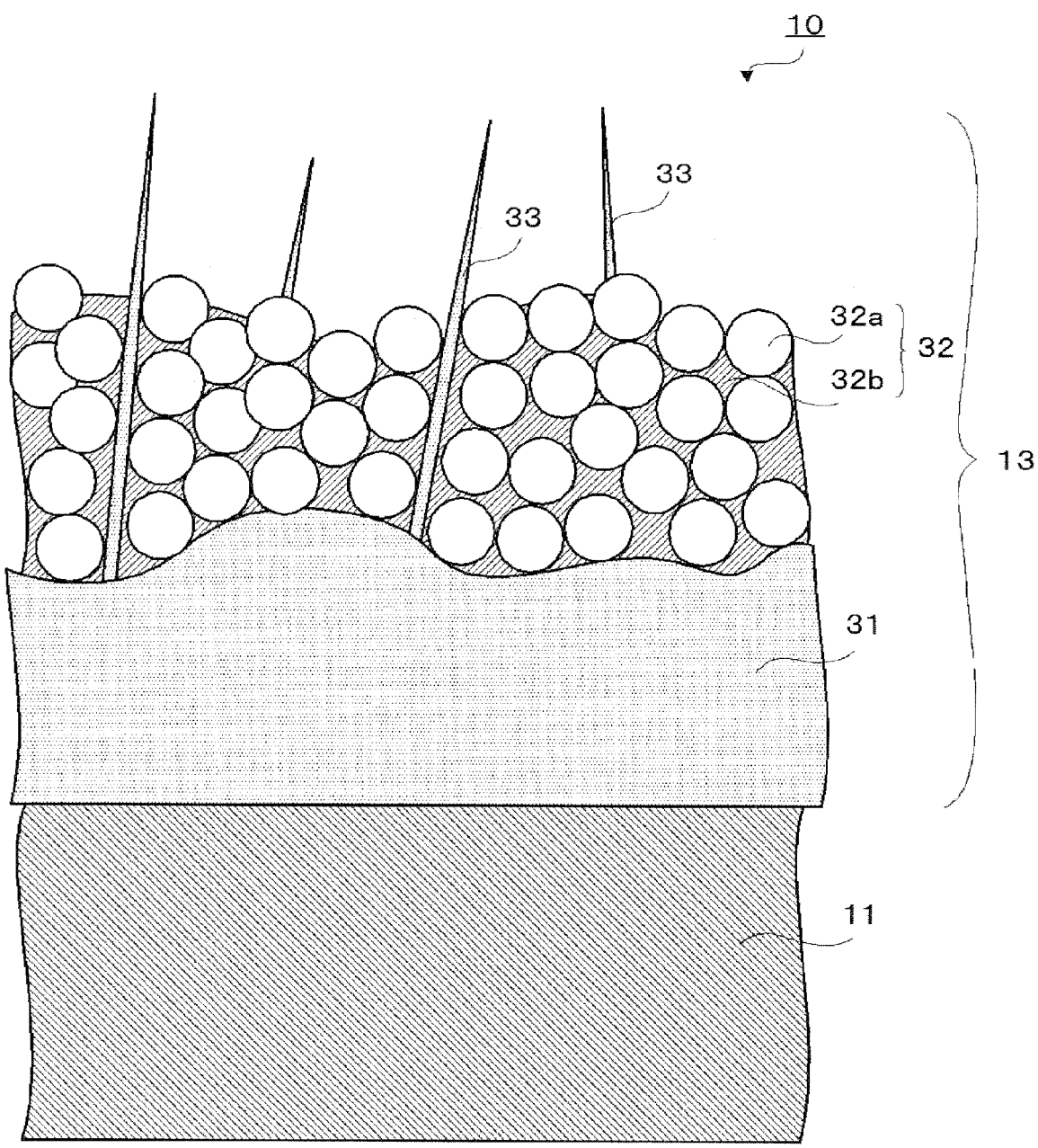
FIG. 5 is a cross-sectional view schematically illustrating a field emission type electrode deposited by a deposition method and the deposition apparatus of the embodiment of the present invention.

Also, in the deposition apparatus 100 according to the embodiment of the present invention, an electron emission film 13 for a field emission type electrode 10 schematically illustrated in FIG. 5 is deposited. The field emission type electrode 10 comprises a substrate 11 and the electron emission film 13 as illustrated in FIG. 5. The electron emission film 13 comprises a carbon nanowall (CNW) 31, nanodiamond (ND) film 32, and needle-like carbon rods 33. The carbon nanowall 31 is a substance in which a number of graphene sheets are aggregated. Also, the nanodiamond film 32 incorporates a plurality of nanocrystalline diamond particles having a crystalline diameter of the order of nanometers, which are continuously deposited on the CNW 31. The needle-like carbon rod 33 is made of graphite, and some of the needle-like carbons 33 are grown from the carbon nanowall 31 and of a needle-like shape.

The chamber 101 shields a substrate 11 from outside air. Inside the chamber 101, the stage 104 made of steel is arranged, and above the stage 104, the anode 102 having a circular planar shape is installed via the heat flow control heat transfer part 110. Also, the chamber 101 is provided with windows 101a and 101b, through which the inside of the chamber 101 can be observed. In the windows 101a and 101b, sheets of heat resistant glass are fitted, and thereby airtightness inside of the chamber 101 is maintained. Outside the window 101a, the spectral luminance meter 107 is installed. Also, outside the window 11b, the spectral luminance meter 108 is arranged, and measures a spectrum from the substrate 11 through the window 101b to analyze and evaluate a substrate temperature and emissivity. Further, through a gas supply pipeline 105a, source gases such as $CH_4$ and $H_2$ are introduced into the chamber 101, and exhausted from the chamber 101 through an exhaust pipeline 105b by the exhaust system 106, and thereby an atmospheric pressure inside the chamber 101 is adjusted. Each of the pipelines 105a and 105b passes through a hole provided to the chamber 101. A gap between the hole and an outer circumference of each of the pipelines 105a and 105b is sealed by a sealing material to thereby ensure the airtightness inside the chamber 101.

The control part 130 is connected to the spectral luminance meter 108, variable power supply 131, and flow rate controller 204 by signal lines (not shown). After being activated, the control part 130 calculates the temperature of the substrate 11 from the spectrum measured by the spectral luminance meter 108, and adjusts a voltage or current value between the anode 102 and the cathode 1003, or a flow rate of helium, which is supplied to the cooling part 201 and selves as refrigerant, such that the temperature of the substrate 11 becomes equal to a predetermined value. Alternatively, the control part 130 may operate an after-mentioned transfer mechanism to adjust a height of the cooling part 201, and thereby adjust how helium discharged from the cooling part 201 is applied to the stage 104, to control the temperature of the substrate 111 via the stage 104, anode 102, and heat flow control heat transfer part 110. As described, the control part 130 controls in combination one or more of the voltage or current value between the anode 102 and the cathode 103, helium flow rate, and a position of the transfer mechanism to control the surface temperature of the substrate 11.

The anode 102 is installed above the stage 104 via the heat flow control heat transfer part 110. Also, the substrate 11 is placed on the anode 102. The anode 102 is formed of metal having high thermal conductivity and high melting point, such as molybdenum (thermal conductivity of 138 W/m·K, and melting point of 2620° C.). Because molybdenum is high melting point metal characterized in that amorphous carbon is unlikely to be deposited on a molybdenum surface in CVD apparatus for depositing a carbon based material, differently from iron group metal, it does not change a contact area between the heat flow control heat transfer part and the other member in the deposition process, and is therefore suitable as a material for the anode 102.

The cathode 103 is installed so as to be opposed to the anode 102. The cathode 103 is formed with a pipeline 103a, into which coolant consisting of water, calcium chloride, and the like is flowed to cool the cathode 103 down to a temperature (500° C. or less) at which a deposit to be an originating point of spark discharge is not deposited on the cathode. Also, when voltage is applied between the anode 102 and the cathode 103, a positive column containing active species (radicals) of the source gases is generated above the anode 102 as indicated by a dotted line in FIG. 1.

The heat flow control heat transfer part 110 is, as illustrated in the diagram, installed between the anode 102 and the stage 104. The heat flow control heat transfer part 110 is a flat plate that is fitted to the shape of the anode 102 and has an annular planar shape of which inner and outer circumferences form concentric circles. A diameter of the inner circumference of the heat flow control heat transfer part 110 is longer than a length of a side of the substrate 11, and shorter than a length of a diagonal line of the substrate 11. Also, the heat flow control heat transfer part 110 is formed of an electrically conductive material having excellent heat resistance and relatively high thermal conductivity, for example, molybdenum. As will be described later in detail, a density of active species that is generated by the plasma CVD processing in the deposition apparatus 100 and contributes to the formation of the ND film is higher in a central region of the positive column and lower in a peripheral region. The substrate 11 is placed such that the central region of the positive column is positioned in the center (center of gravity) of the substrate 11. At this time, the substrate 11 is placed such that the heat flow control heat transfer part 110 is opposed to the substrate 11 via the anode 102 with being overlapped with at least a part of a peripheral area of the substrate 11, more specifically, for example, as illustrated in FIG. 2A, respective corner areas 11a of the substrate 11 are opposed to the heat flow control heat transfer part 110 with being overlapped with the heat flow control heat transfer part 110. The deposition apparatus 100 is configured such that the deposition is performed with the positive column covering not only a central area of the substrate 11 but also the corner areas 11a overlapped with the heat flow control heat transfer part 110. In the corner areas 11a, which are the most distant areas from the center of the substrate 11, the density of the active species contributing to the formation of the ND film is lower than that in the center of the substrate 11, and property of the formed film cannot be made equal to that formed in the center of the substrate 11 at the same temperature. However, the deposition apparatus 100 is installed with the heat flow control heat transfer part 110, which is provided to have a configuration in which more heat is released from the peripheral areas (corner areas 11a overlapped with the heat flow control heat transfer part 110) of the substrate 111 placed on the anode 102 to conform the film property in the area where the density of the active species contributing to the formation of the ND film is low to that in the area where the density of the active species contributing to the formation of the ND film is high. Also, the deposition apparatus 100 generates a temperature gradient between the areas where the density of the active species contributing to the formation of the ND film on the substrate 11 is high and that is low. By increasing a temperature of the central area of the substrate and decreasing a temperature of the peripheral area of the substrate in this manner to thereby provide the gradient of the substrate temperature correspondingly to a gradient of the density of the active species on the substrate, the deposition can be performed with the film property being uniform within the surface of the substrate. In addition, the heat flow control heat transfer part 110 may be installed so as to be opposed to the entire peripheral edge of the substrate 11.

Figure 2B:
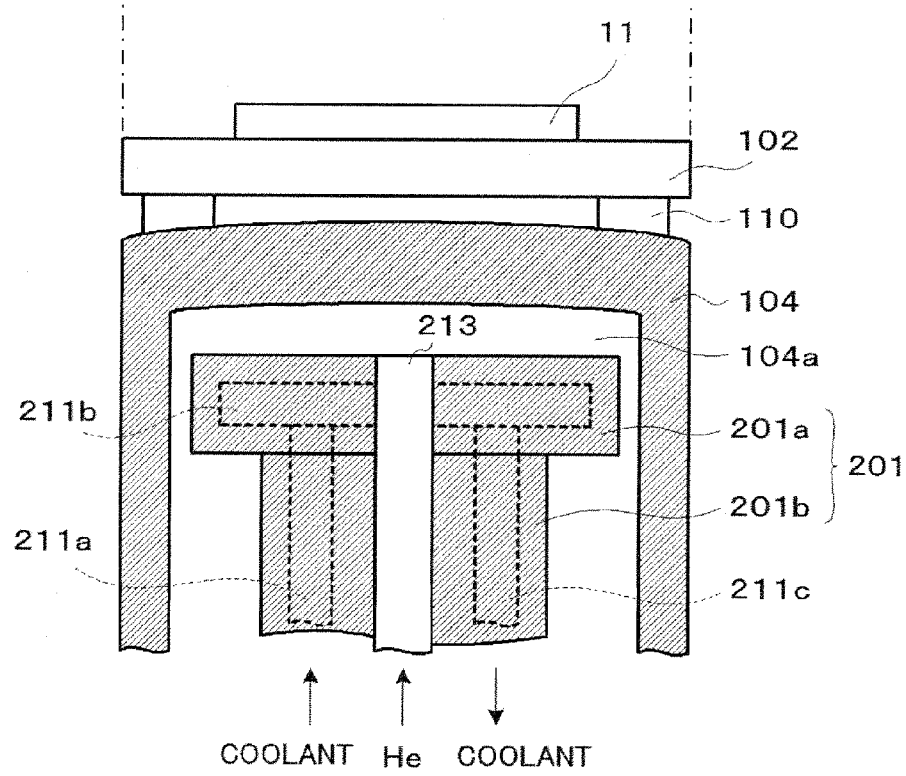
FIG. 2B is a cross-sectional view illustrating the example configuration of the heat flow control heat transfer part.

The stage 104 is installed inside the chamber 101, and has installed thereabove with the anode 102 via the heat flow control heat transfer part 110. Also, the stage 104 is provided with a closed space 104a (the coolants, including helium gas, supplied from the pipeline 213 and appearing in the following description are exhausted by a proper method), inside which the cooling system 120 is provided. The cooling part 201 of the cooling system 120 comprises a flat plate part 201a and a tubular part 201b, and is configured to be vertically movable by a transfer mechanism. The transfer mechanism is, for example, configured as follows and hoists and lowers the cooling part 201. A support plate 205 having two holes is fixed on the inner wall of the stage 104. To one of the holes a tubular part 201b is inserted and the cooling part 201 comes in contact with the support plate 205 and supported so as to be vertically slidable. To the other hole of the support plate 205 is provided a bearing 206. A trapezoid lead screw 207, on which a spiral groove is formed, is inserted to the bearing 206. The trapezoid lead screw 207 is connected to a motor 208 and configured to freely rotate by being driven by the motor 208. The trapezoid lead screw 207 fits into a trapezoid screw nut 209 fixed to the tubular part 201b. In this configuration, the rotation of the trapezoid lead screw 207 hoists and lowers the cooling part 201 together with the trapezoid screw nut 209. By bringing the flat plate part 201a of the cooling part 201 close to or into abutting contact with a lower surface of the stage 104, the stage 104 is cooled, and also the heat flow control heat transfer part 110, anode 102, and substrate 11 are cooled. Note that, for convenience of illustration, an upper surface of the stage 104 is flat in FIG. 1; however, more properly, it may be provided in a convex shape toward the anode 102 side as illustrated in FIG. 2 because of thermal stress due to a difference in temperature between the inside and outside of the chamber 101, and a difference in pressure via the stage 104 between the inside of the chamber 101 and the space 104a inside the stage 104a, and along with this, the lower surface of the stage 104 may also be provided in a convex shape toward the anode 102 side.

The cooling system 120 is provided inside the space 104a of the stage 104, and intended for cooling the substrate 11 via the stage 104, heat flow control heat transfer part 110, and anode 102. The cooling system 120 comprises, as illustrates in FIG. 1, a cooling part 201, water-cooling device 202, helium supply source 203, flow rate controller 204, and pipelines 211a, 211b, 211c, and 213. The pipelines 211a, 211c, and 213 are movable along with the move of the cooling part 201.

The cooling part 201 comprises the flat plate part 201a and tubular part 201b. The cooling part 201 is formed of metal having high thermal conductivity, such as copper. The cooling part 201 is vertically movable by the above-described transfer mechanism, and as schematically illustrated in FIG. 4, by bringing the cooling part 201 into abutting contact with or close to the stage 104 in addition to cooling by blowing of the refrigerant helium gas, thermal conduction between the both can be improved. Based on this, the stage 104 in abutting contact with or close to the cooling part 201 cools the anode 102 via the heat flow control heat transfer part 110 located thereon, and the anode 102 further cools the substrate 11.

Figure 3A:
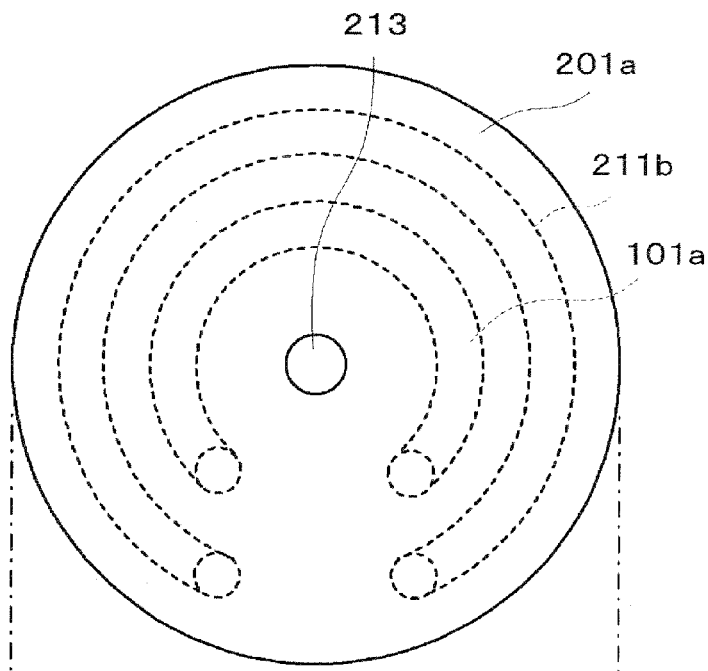
FIG. 3A is a plan view illustrating an example configuration of a cooling system in the embodiment of the present invention.
Figure 3B:
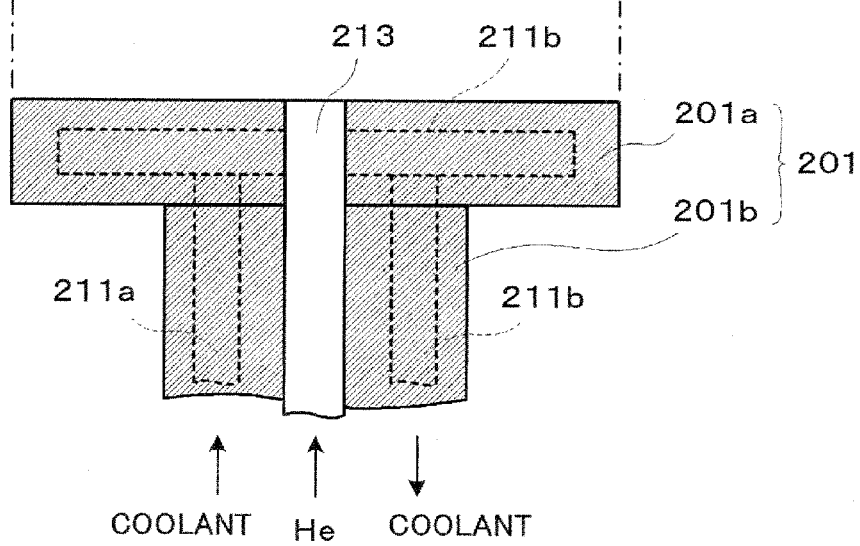
FIG. 3B is a cross-sectional view illustrating the example configuration of the cooling system.

Also, the flat plate part 201a and tubular part 201b of the cooling part 201 are formed with the pipeline 211b, and those 211a and 211c, respectively, and the pipelines 211a, 211b, and 211c are connected to each other. The coolant such as the cooled water or the cooled calcium chloride solution is circulated so as to be flowed into the pipeline 211a to the pipeline 211b, and discharged from the pipeline 211c, and thereby cools the entire cooling part 201. The flat plate part 201a is, as illustrated in FIGS. 3A and 3B, formed with the pipeline 211b. The pipeline 211b is formed in a substantially circular shape (arc shape) correspondingly to the shape of the upper surface of the stage 104 so as to cool the stage 104 to uniform temperature, and a plurality of the pipelines 211b are concentrically provided around the pipeline 213 for helium. Also, the pipelines 211a and 211c are formed so as to pass through the tubular part 201b, and respectively connected to the water-cooling device 202. The coolant discharged from the pipeline 211c is cooled again by the water-cooling device 202, and then circulated so as to be carried into the pipeline 211a again.

Also, the pipeline 213 is provided to the centers of the flat plate part 201a and tubular part 201b of the cooling part 201, and through the pipeline 213 and by flow rate controller 204, helium is discharged from the helium supply source 203. The flow rate controller 204 has a pump for controlling a flow rate of helium discharged from the helium supply source 203, and can control the flow rate of the helium gas at room temperature within, for example, a range of 0 to 1 (l/min). Helium gas (thermal conductivity of $150 \times 10^{-3}$ (W/m·K)) is more excellent in thermal conductivity than, for example, nitrogen gas (thermal conductivity of $260 \times 10^{-4}$ (W/m·K)), and therefore can cool the stage 104 rapidly. Note that the cooling gas may not be necessarily at room temperature, but may be lower than a heating temperature for the substrate 11 upon deposition of the carbon nanowall 311. Also, the cooling gas may be discharged immediately before the flat plate part 201a of the cooling part 201 is brought into abutting contact with the stage 104, or at the time when the flat plate part 201a of the cooling part 201 is in abutting contact with the stage 104, or immediately after the flat plate part 201a of the cooling part 201 is brought into abutting contact with the stage 104. Further, helium may be mixed with nitrogen.

The spectral luminance meter 107 is used to evaluate a relative density distribution of the active species from an emission spectrum of plasma radiation. The spectral luminance meter 107 is set at an angle not influenced by radiation from the substrate 11 as much as possible, i.e., at an angle parallel to a planar direction of the upper surface of the substrate 11. Also, it is considered reasonable that the relative density of CH to be evaluated has a gradient in also a direction normal to the upper surface of the substrate 11, and therefore light from plasma close to the upper surface of the substrate 11 as much as possible, more preferably light from plasma at a position 1 mm above the upper surface of the substrate 11 is measured.

The spectral luminance meter 108 is one for measuring thermal radiation from the substrate 11, and measures a temperature of the substrate 11 by focusing on the upper surface of the substrate at a predetermined angle (e.g., 15°) to the planar direction of the upper surface of the substrate 11 through the window 101b provided to the chamber. In the present embodiment, the substrate temperature and emissivity are simultaneously evaluated by fitting, on the basis of a nonlinear least square method, the Planck's radiation equation in which temperature and emissivity have degrees of freedom and an expression linearly combining a spectrum measured by the spectral luminance meter 108 at a temperature at which the Planck radiation takes a value of a measurement error or less to the radiation light from the substrate upon deposition process. According to this temperature measurement method, the substrate temperature in the deposition process can be sequentially measured, and therefore information on the substrate temperature can be fed back to control the deposition on the substrate. Specifically, the following four steps are included to evaluate the temperature and emissivity of the substrate: (1) the step of measuring the spectrum of plasma radiation by the spectral luminance meter 108 in order to preliminarily measure plasma radiation serving as noise for the substrate temperature; (2) the step of selecting a wavelength region required for the fitting: (3) the step of determining the plasma radiation spectrum; and (4) the step of fitting the theoretical formula based on the Planck's radiation law and the expression linearly combining the plasma radiation spectrum to the measured spectrum on the basis of the nonlinear least square method.

Next, the deposition process is described.

First, a nickel plate, for example, is cut out as the substrate 11, and then sufficiently degreased and ultrasonic-cleaned with ethanol or acetone.

The substrate 11 is placed on the anode 102 of the deposition apparatus 100 having the configuration exemplified in FIG. 1. After the substrate 11 has been placed, the chamber 101 is depressurized with use of the exhaust system 106, and then hydrogen gas and compound gas, such as methane, in which carbon is contained in the composition thereof (carbon-containing compound) are introduced from the gas supply pipeline 105a.

The compound gas in which carbon is contained in the source gas composition is preferably within a range of 3 to 30 vol % of the total. For example, a methane flow rate is set to 50 sccm, hydrogen flow rate to 500 sccm, and total pressure to 0.05 to 1.5 atm, preferably to 0.07 to 0.1 atm. Also, a DC power supply is applied between the anode 102 and the cathode 103 to generate plasma, and a state of the plasma and a temperature of the substrate 11 are controlled.

Upon deposition of the carbon nanowall 31, the deposition is performed for a predetermined time period under the condition that a temperature in a location on the substrate where the carbon nanowall 31 is deposited is set to 900 to 1100° C. The temperature is evaluated from a spectrum measured by the spectral luminance meter 108 on the basis of the above-described procedure. At this time, the cooling part 201 of the cooling system 120 is sufficiently separated from the anode 102 to avoid an influence on temperature of the anode 102.

After the underlying carbon nanowall 31 is sufficiently deposited, the anode 102 is cooled by elevating the cooling part 201 of the cooling system 120 by, for example, 100 mm, which is at a temperature further below that of the plasma heated anode 102, to bring it close to or into abutting contact with the stage 104 without changing the gas atmosphere. At this time, because the anode 102 on which the substrate 11 is placed is installed above the stage 104 via the heat flow control heat transfer part 110, heat of the substrate 11 and anode 102 is transferred to the stage 104 via the heat flow control heat transfer part 110.

This cools the substrate 11 placed on the anode 102, and consequently the surface of the substrate 11 is rapidly cooled to a temperature appropriate for deposition of the plurality of diamond nanoparticles, which is 10° C. or more lower than that upon deposition of the carbon nanowall. Note that, preferably, to stably maintain the plasma, an applied voltage or current value between the anode and the cathode is not changed too much at timing when the cooling part of the cooling system is brought close to or into abutting contact with the stage 104.

After the growth of the carbon nanowall 31 has been suppressed due to the rapid cooling of the substrate 11, the plurality of diamond nanoparticles 32a having a particle size of approximately 5 to 10 nm start to grow on the carbon nanowall 31 and then the diamond nanoparticle 32a growth becomes dominant in place of the carbon nanowall 31 growth. Subsequently, the nanocrystalline diamond film 32 having a layered structure including aggregates of the diamond nanoparticles 32a is formed, and in regions where the aggregates of the diamond nanoparticles 32a are not formed, i.e., in gaps between the aggregates of the diamond nanoparticles 32a as illustrated in FIG. 5, needle-like carbon rods 33 into which a surface of the carbon nanowall 31 is transformed are grown and formed such that tip portions thereof protrude from a surface of the nanocrystalline diamond film 32. Originating points of the needle-like carbon rods 33 are mainly at the surface of the carbon nanowall 31, but the needle-like carbon rods 33 may originate at the other points. However, as will be described later, the needle-like carbon rod 33 grown from the carbon nanowall 31 has larger mechanical strength because an inside thereof is filled with a graphite layer core, and also has a rod like structure in which an electric field is likely to be concentrated, and therefore electrons can be stably emitted from the tip of the needle-like carbon rod 33 grown from the carbon nanowall 31.

At this time, in comparison with a configuration in which the heat flow control heat transfer part 110 is not installed, a configuration having the heat flow control heat transfer part 110 for cooling the peripheral area of the substrate 11 can control a temperature distribution on the substrate by varying the thermal resistance of the region from the central area within the substrate 11 to the chamber connected with the cooling part 201 or placing stage, from that of the region from a peripheral area within the substrate 11 to the chamber connected with the cooling part 201 or placing stage, A back surface area of an opposed surface area of the anode 102 opposed to the central area of the substrate 11, i.e., opposed to the area where the density of the active species contributing the formation of the ND film is high, is not provided with the heat flow control heat transfer part 110, and also between the back surface area and the placing stage 104, there exists only gas. Gas has poor thermal conductivity, and therefore heat of the central area of the substrate 11 is mostly transferred to the corner areas 11a, which are the most distant areas from the central area of the substrate 11, and then to the placing stage via the heat flow control heat transfer part 110. On the other hand, in back surface areas of opposed areas of the anode 102 opposed to the corner areas 11a, which are the most distant areas from the central area of the substrate 11, i.e., areas where the density of the active species contributing to the formation of the ND film is lower than that in the central area of the substrate 11, solid, i.e., the heat flow control heat transfer part 110 having higher thermal conductivity than that of gas exists. Accordingly, the thermal resistance between any of the corner areas 11a of the substrate 11 and the placing stage 104 is smaller than that between the central area of the substrate 11 and the placing stage 104.

Note that the temperature measurement procedure used for the deposition also evaluates an emissivity simultaneously with the measurement of a substrate temperature. The emissivity is also influenced by a transmittance or the like of glass, and therefore takes a relative value. However, in the present embodiment, the underlying film is the carbon nanowall, and the sufficiently grown carbon nanowall has an emissivity of 1, so that by setting to 1 a value of relative emissivity at the time when the emissivity reaches a plateau due to the carbon nanowall growth, an accurate emissivity can be evaluated in the process of formation of the diamond nanoparticles on the carbon nanowall.

At the final stage of the deposition, the voltage applied between the anode 102 and the cathode 103 is stopped; subsequently the supply of the source gases is stopped; nitrogen gas is supplied into the chamber 101 as purge gas to recover to normal pressure; and then the substrate 31 is taken out with temperature being recovered to normal temperature.

Figure 6:
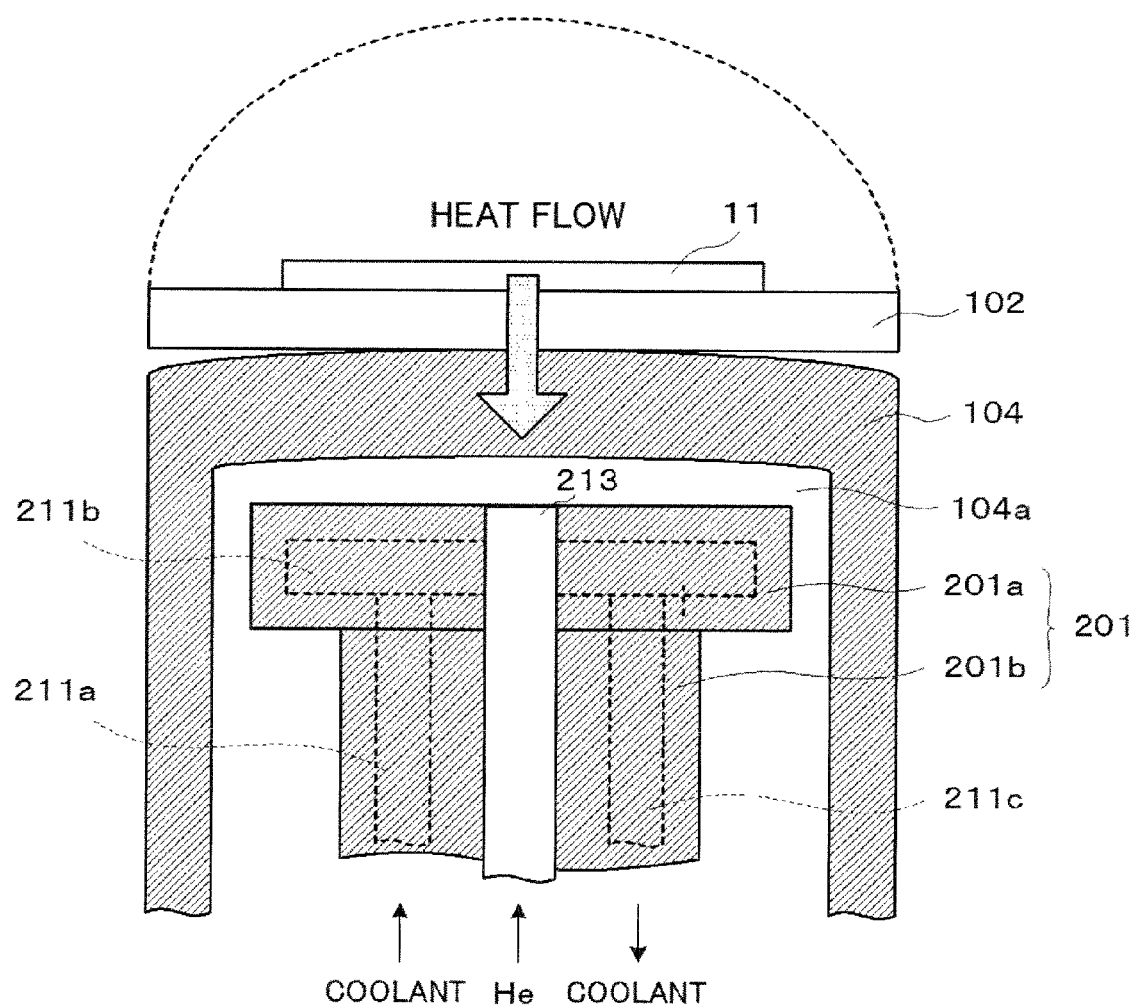
FIG. 6 is a diagram schematically illustrating a heat flow near a substrate in a configuration in which the heat flow control heat transfer part of the embodiment of the present invention is omitted.
Figure 7:
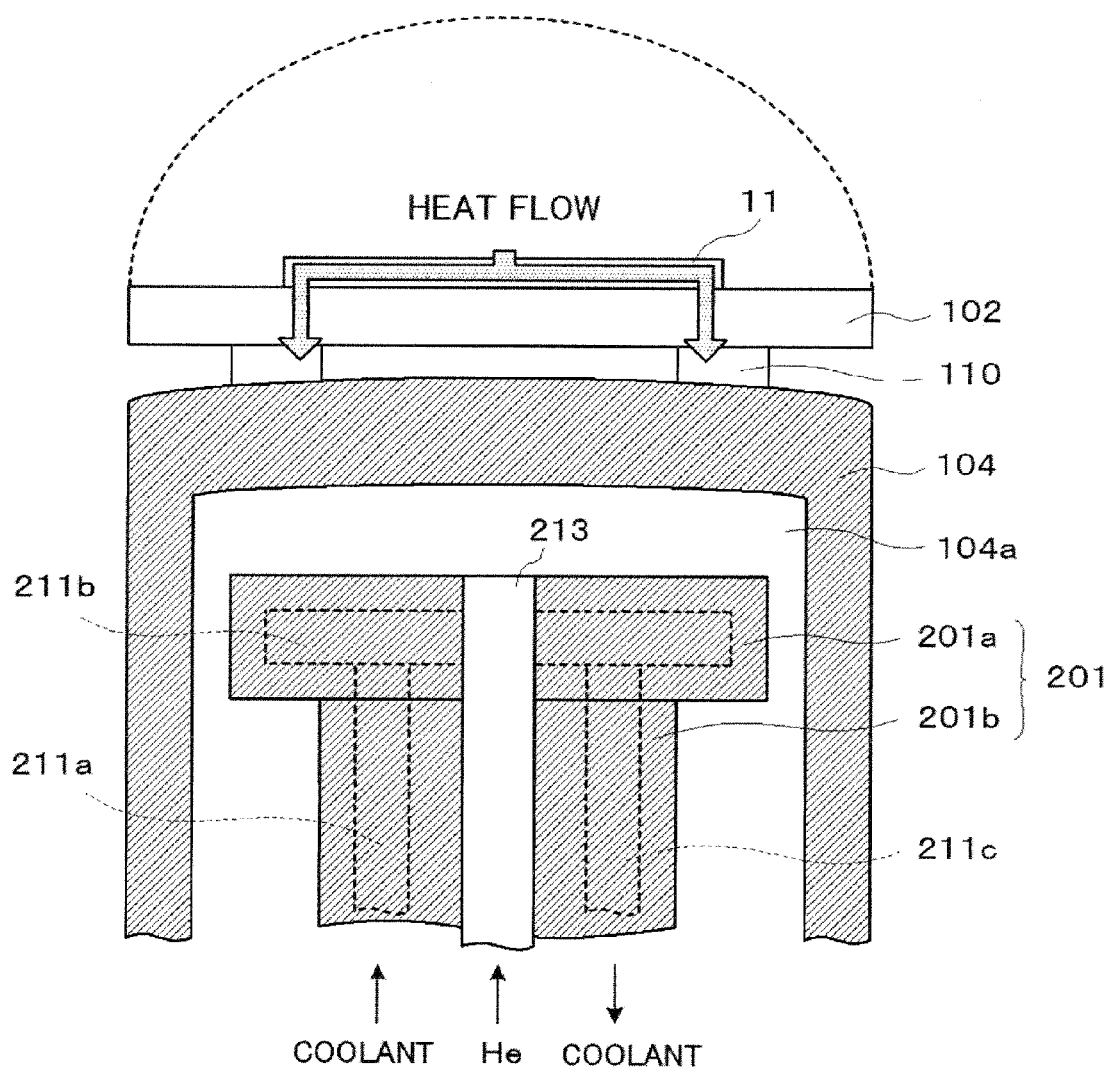
FIG. 7 is a diagram schematically illustrating a heat flow near a substrate in the embodiment of the present invention.

In the present invention, the heat flow control heat transfer part 110 is provided to have a hollow structure that is not overlapped with the central area of the substrate, i.e., the area in contact with the region where the density of the active species contributing to the formation of the ND film is high, and also to have the ring-like structure that is overlapped with the peripheral area, the area in contact with the region where the density of the active species contributing to the formation of the ND film is low, and thereby the temperature gradient within the surface of the substrate can be controlled. For example, as illustrated in FIG. 6, in a configuration in which the cooling ring is not provided, around the center of the substrate 11 (electrode) where energy provided from the plasma is largest, heat is most likely to be transferred, and consequently the substrate surface is brought to totally relatively uniform temperature. At this time, a heat flow flowing from the anode 102 to the stage 104 mainly flows from the center of the anode 102 toward the stage 104 around the center (downward in FIG. 6), and a heat flow generated in the direction parallel to the substrate surface (horizontal direction in FIG. 6) is small. On the other hand, in the configuration of the present embodiment comprising the heat flow control heat transfer part 110, more heat is likely to be transferred from the peripheral area of the electrode 102 to the stage 104 rather than from the central area of the electrode 102 as illustrated in FIG. 7. Based on this, the temperature gradient from the central to peripheral area of the substrate 11 and electrode 102 becomes larger as compared with the case where the heat flow control heat transfer part 110 is not used. As described, by changing a shape or size of the heat flow control heat transfer part 110, adjustment of the substrate temperature in the central area of the substrate where the density of the active species contributing to the formation of the nanodiamond film within the positive column is high, and that in the peripheral area of the substrate where the density of the active species is lower than that in the central area becomes possible depending on the density of the active species, and therefore the film having uniform film property of the central and peripheral area of the substrate can be deposited.

Also, methods generally performed for improving uniformity of a film in deposition by a CVD method include ones in which a substrate is rotated in the growth process of the film, a shape of an electrode is changed, and a substrate temperature is made uniform, or the like. In the method in which the substrate is rotated, there exists a problem that it is difficult to make deposition nonuniformity uniform in a radial direction with respect to a rotational axis. Also, there exists another problem that because the substrate is rotated, If a deposition area is enlarged, the apparatus size is increased as well. Next, in the method in which the electrode shape is changed, there exists a problem that because the electrode shape is no longer simple, an electric field is likely to be concentrated near the electrode where electric field intensity is increased, and therefore corona discharge or arc discharge disturbing the deposition is likely to occur. Also, in the method in which the substrate temperature is made uniform a deposition area can be expected to be large by this method in the case of the typical MD film; however, in the case of deposition largely influenced by an active species density distribution in plasma, such as the ND deposition, making the substrate temperature uniform rather decreases a uniform deposition area.

On the other hand, in the deposition apparatus of the present invention, by providing the heat flow control heat transfer part, the thermal resistance from the peripheral area of the substrate to the chamber connected with the cooling part or placing stage can be decreased than that from the central area of the substrate to the chamber connected with the cooling part or placing stage to cause heat flows from the central to peripheral area within the substrate, and thereby the substrate temperature gradient can be easily generated depending on the active species density distribution. Accordingly, the film property can be made uniform between the central area of the substrate where the density of the active species contributing to the ND deposition is high and the peripheral area of the substrate where the density of the active species contributing to the deposition is lower than that in the central area of the substrate, and therefore the film having good uniformity can be formed within the surface of the substrate. As described above, according to the configuration of the present invention, the apparatus is not complicated because the substrate is not rotated, and also the plasma is easily generated because the shape of the electrode is not changed.

As described, according to the deposition apparatus and deposition method of the present embodiment, the film having good in-plane uniformity can be formed.

EXAMPLE

In the following, there is provided an example where two types of films, i.e., CNW and ND films for the electron emission film, are deposited by the above-described deposition apparatus.

In the present example, the anode and cathode made of molybdenum, having a diameter of 140 mm and thickness of 8 mm, were used, and a distance between the electrodes was set to 60 mm. As the heat flow control heat transfer part, a ring made of molybdenum was used. An outer diameter, inner diameter, and thickness of the heat flow control heat transfer part were respectively 102 mm, 67 mm, and 2 mm. Note that a thermal conductivity of molybdenum is 138 W/(m·K). As the substrate, four square-shaped silicon wafers (resistivity of 0.1 Ωcm or less) having a side of 30 mm and thickness of 0.7 mm were used. Note that a distance from the center of the anode 102 (center of the substrate) to a tip of the corner area 11a of the substrate is 42 mm. In the present example, each of the substrates was arranged such that an edge of the substrate was opposed to the heat flow control heat transfer part via the anode. As the source gases, 500 sccm of $H_2$, 55 sccm of $CH_4$, and 50 sccm of Ar were introduced into the chamber. Also, a pressure inside the chamber was set to 60 Torr, and a current to DC 12 A. Further, as the coolant in the cooling system, water having a temperature of 19° C. was used, and flowed at 20 L/min. Still further, as the blowing cooling gas, 50 sccm of helium was introduced. In addition, a distance from the center of the substrate to the spectral luminance meter 108 was set to 60 cm.

First, as preprocessing, the substrate was degreased and ultrasonic-cleaned as described above. The substrate was then placed on the anode in the deposition apparatus having the configuration of the above-described embodiment, and hydrogen was introduced at a flow rate of 500 sccm from a vacuum state to generate plasma. At this time, the cooling part of the cooling system was kept at a position separated from the back surface of the stage by 30 mm or more. Subsequently, as the pressure increased, the current was increased, and when the substrate temperature reached 800° C., $CH_4$ was additionally introduced at a flow rate of 50 sccm ($CH_4$ concentration of 11%). The applied power was successively increased, and when a total pressure and current respectively reached 60 Torr and 12 A, conditions were fixed. The time when the conditions were fixed was defined as a start time of the deposition.

Figure 8:
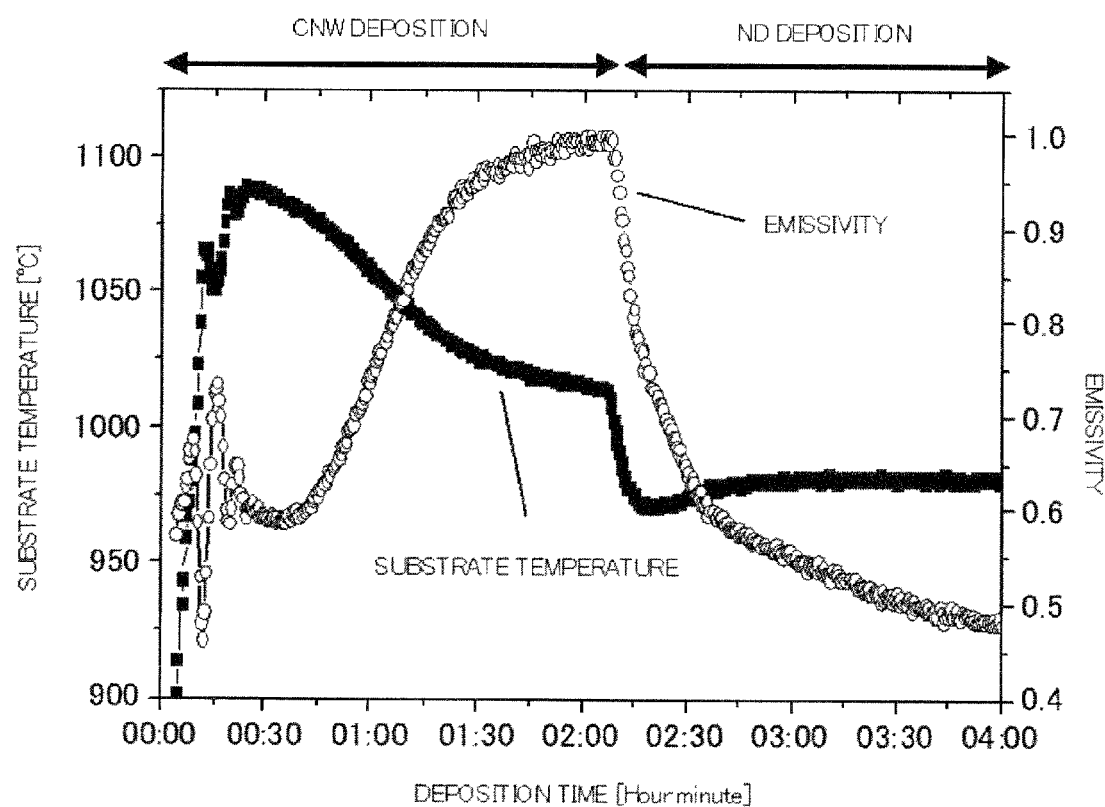
FIG. 8 is a diagram illustrating temperature variation upon deposition of an electron emission film.

FIG. 8 illustrates a temperature of the substrate surface calculated from spectra measured by the spectral luminance meter 108. As illustrated in FIG. 8, the CNW was deposited by keeping the above-described deposition conditions for 2 hours. Subsequently, the cooling plate (flat plate part 201a of the cooling part 201) and the electrode stage were brought close to each other to set a gap between them to 1 mm, and by continuously introducing the He gas into the gap, an environment near the substrate was changed to a nanodiamond growth region and the ND film was deposited. The flow rate of the He gas was feedback controlled such that the substrate temperature of the area corresponding to the center of the electrode was adjusted to 980° C. By keeping this state for 2 hours, the ND layer was deposited on the CNR.

Figure 9:
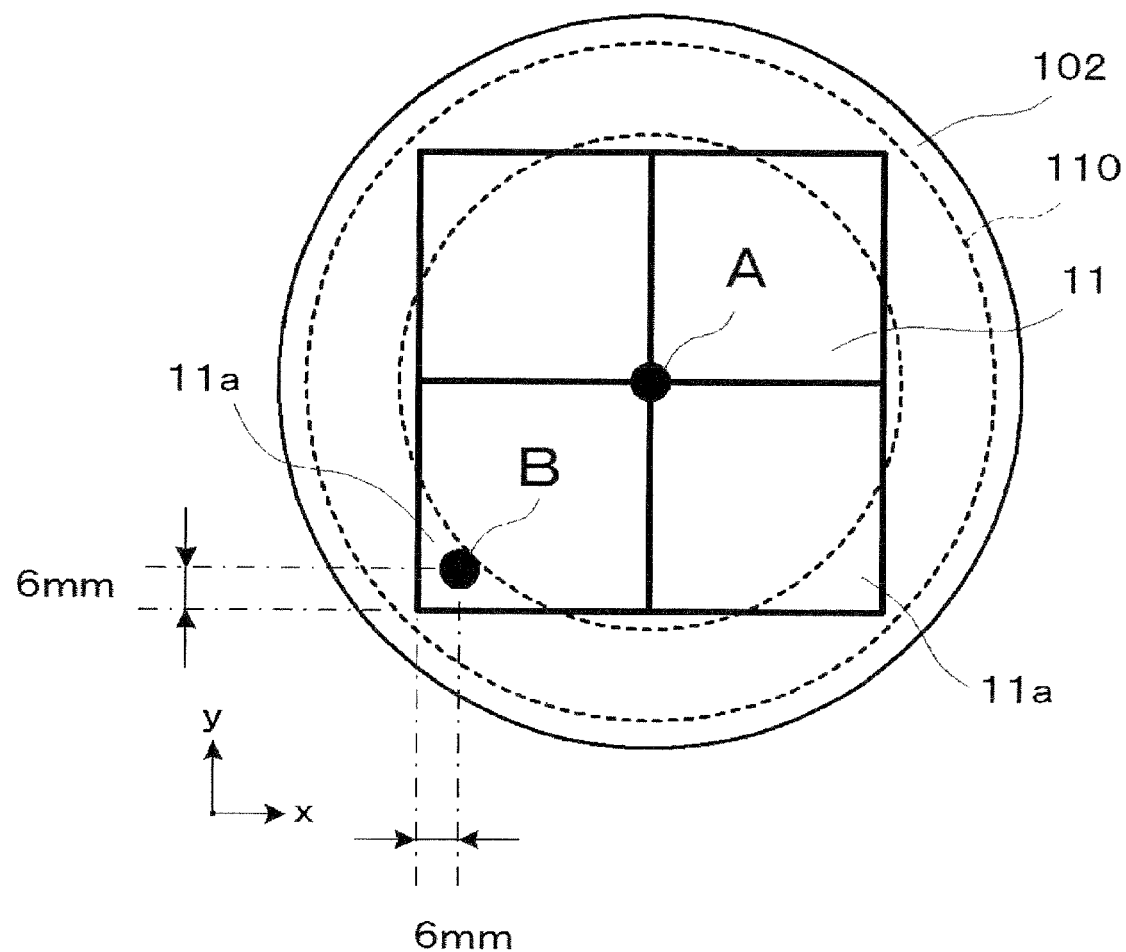
FIG. 9 is a diagram illustrating arrangement of an anode, substrate, and heat flow control heat transfer part, and measurement points in an example of the present invention.

In addition, the substrate temperature was measured at measurement points A and B illustrated in FIG. 9 on the basis of the substrate temperature analysis using the spectral luminance meter 108 as described above. Also, the substrate temperature upon deposition of the ND film was fed back with reference to the temperature at the measurement point A. As illustrated in FIG. 9, the measurement point A is located at the center of the anode 102 (center of the substrate), and that B was set to a point 6 mm inside from the tip of the corner area 11a of the substrate in both x and y directions.

Also, a profile of the CH radicals contributing to the formation of the ND film was evaluated from an emission spectrum of the plasma in the following manner.

Figure 10:
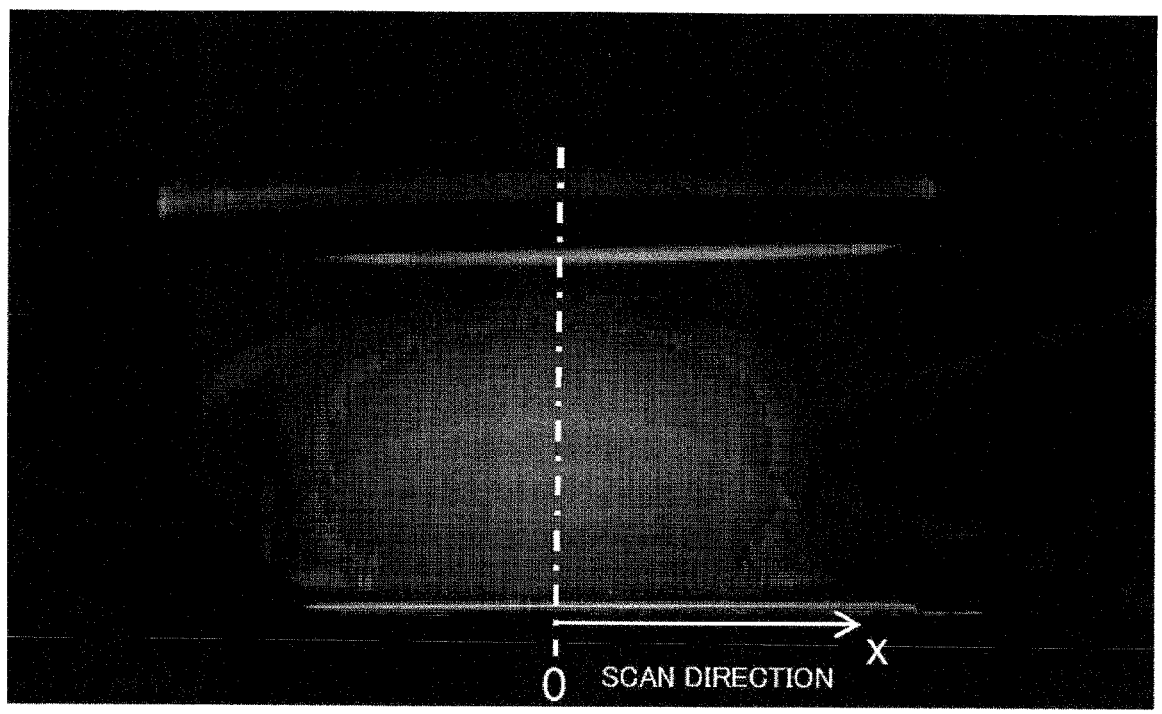
FIG. 10 is a photograph showing a positive column and a scan direction by a spectral luminance meter in the example of the present invention.
Figure 11:
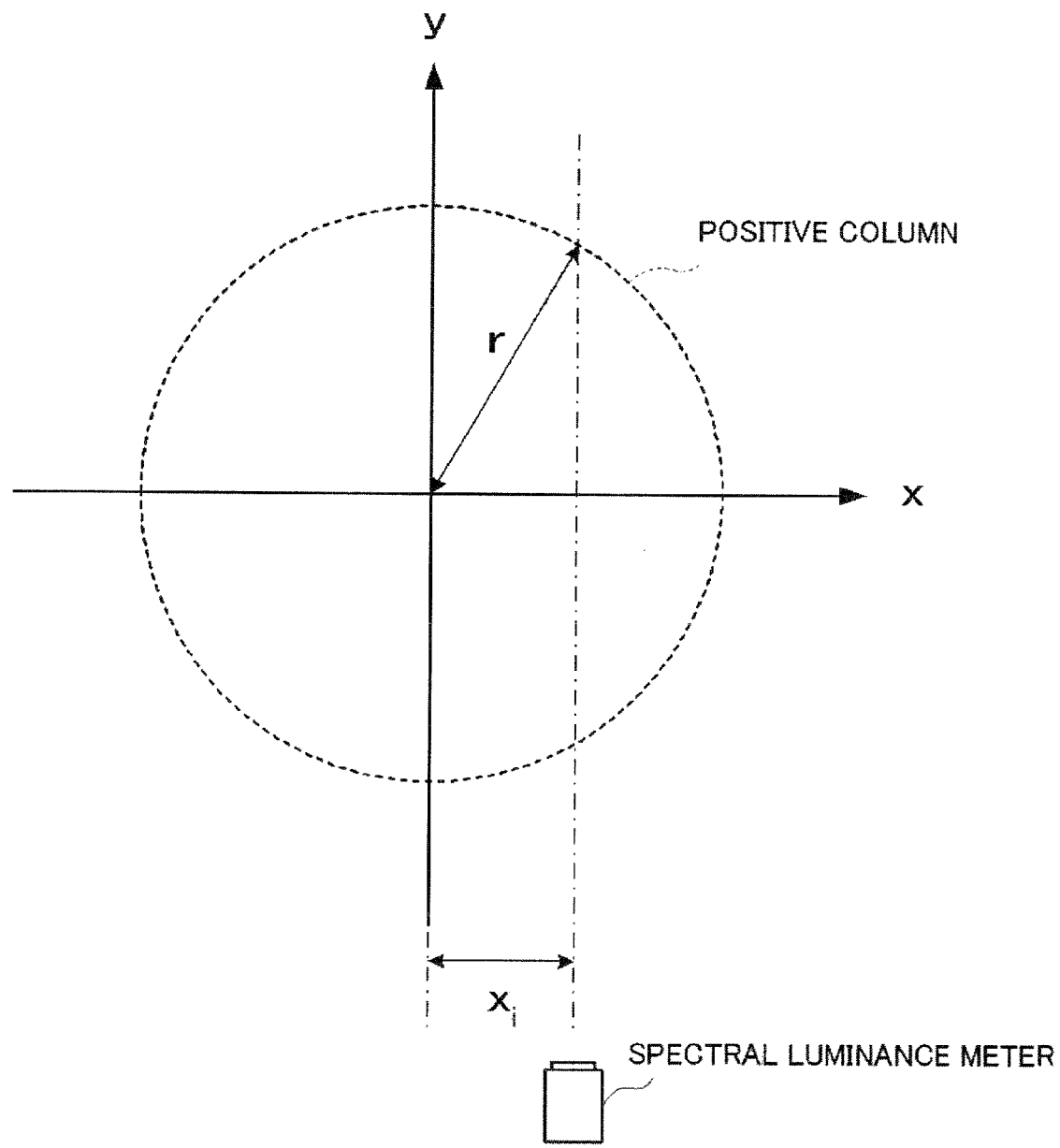
FIG. 11 is a diagram schematically illustrating the positive column and the scan direction by the spectral luminance meter in the example of the present invention.

First, regarding the plasma measurement, the spectral luminance meter 107 at a position separate from the center of the electrode by 60 cm was used and scanned in the x direction from the center of the substrate to perform the measurement. That is, with the positive column being generated as illustrated in FIG. 10, light radiated from the plasma approximately 1 mm above the substrate was measured from the direction parallel to the electrode surface through the quartz glass of the window provided to the chamber. Also, as illustrated in FIG. 11, an emission spectrum from the plasma in a space that is located at a position $x_i$ in the x axis direction from the central axis of the electrode and 1 mm above the upper surface of the substrate was measured by the spectral luminance meter 107 with the center of the electrode being focused on. The measurement was performed while parallel moving the spectral luminance meter 107 along the x axis at intervals of 6 mm, and a radiance data group $L(x_i)$ of a line spectrum at each of the positions was evaluated.

Figure 12:
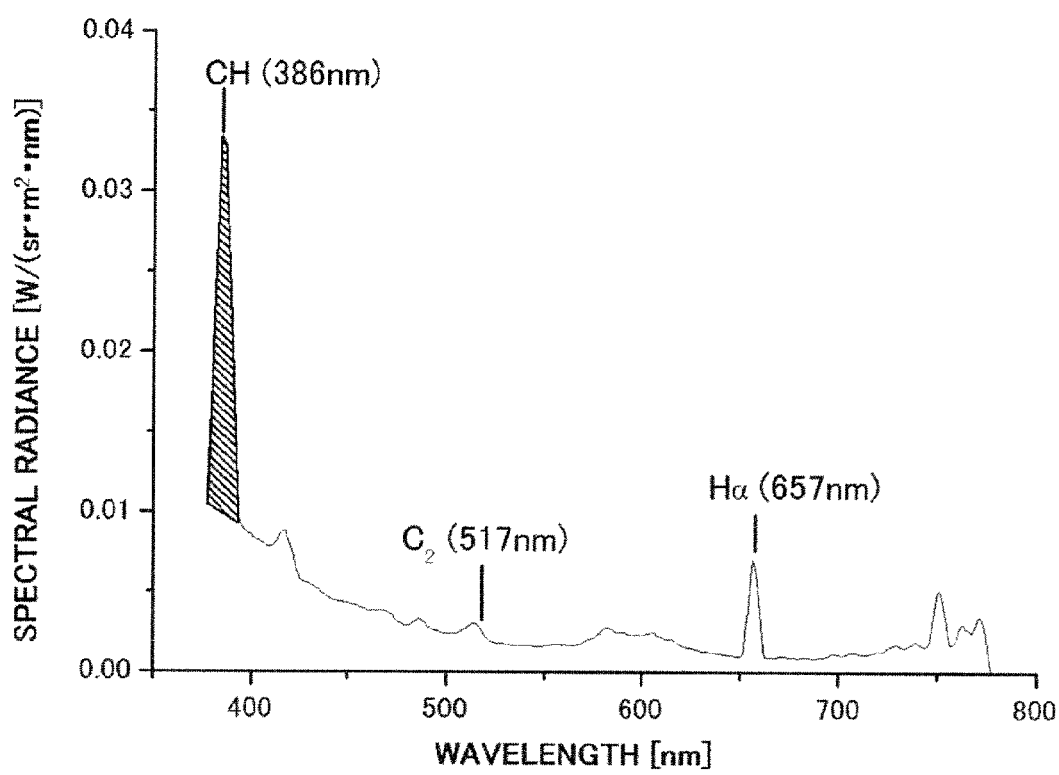
FIG. 12 is a diagram illustrating a spectrum of plasma.
Figure 13:
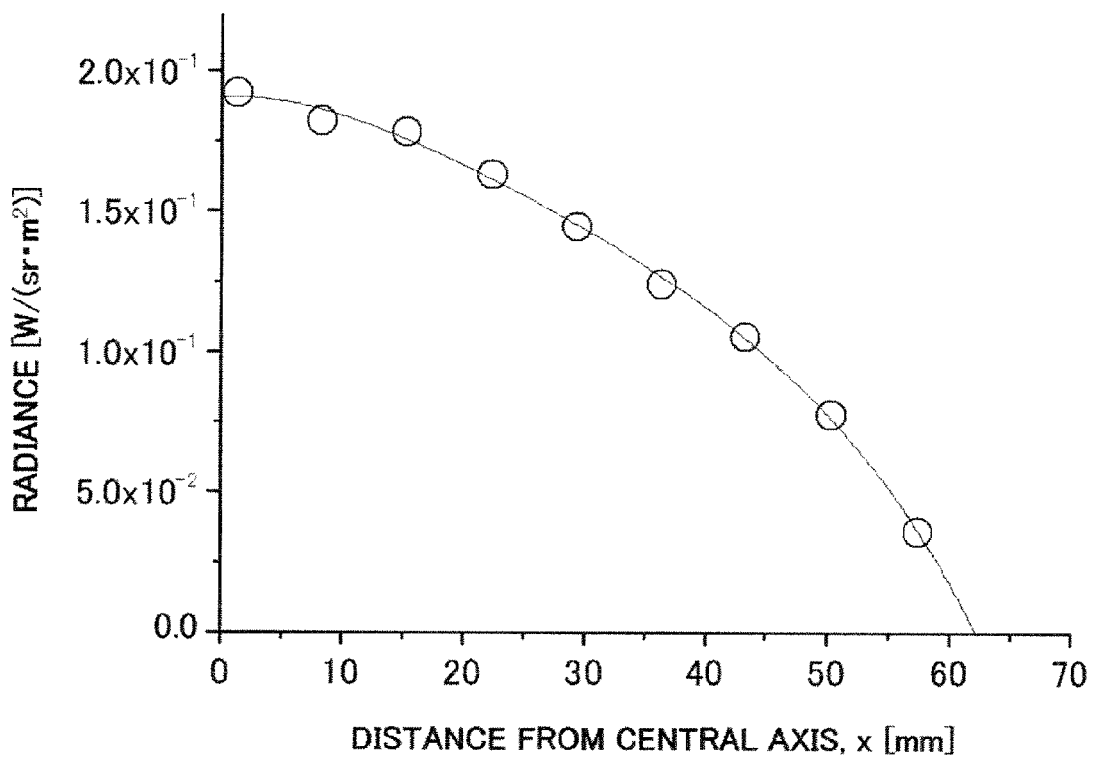
FIG. 13 is a diagram illustrating a relationship between a distance from a central axis of the substrate and a radiance.

Then, a contribution of a continuous spectrum was subtracted from the measured spectrum, and then the resulting spectrum was integrated (for the CH radicals, a shaded area of a spectrum illustrated in FIG. 12 was integrated) to obtain a radiance of the line spectrum. Subsequently, by plotting the radiance data group $L(x_i)$ as illustrated in FIG. 13, and fitting the following Expression 1, constants A to E were obtained to obtain a formula of the function Lf(x). Note that a positive minimum value R meeting Lf(R)=0 was obtained, and Lf(x) was assumed to be zero for a region meeting x>R.

$$L_f(x) = A + Bx + Cx^2 + Dx^3 + Ex^4 \qquad \text{Expression 1}$$

Note that for x<R, Expression 1 is established.
On the other hand, for x>R, Lf(x)=0.
Also, A to E in Expression 1 are as follows:
A: 0.19063
B: 0.00028

C: −0.00011
D: 2.4929×10⁻⁶
E: −2.4465×10⁻⁸

Figure 14:
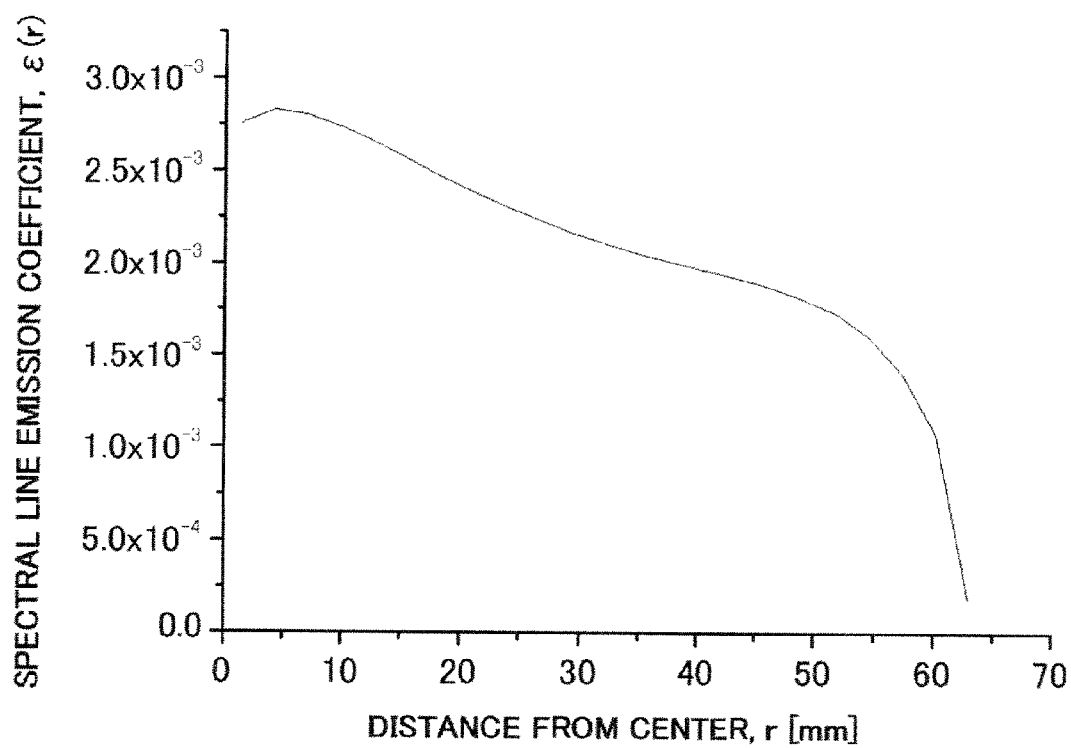
FIG. 14 is a diagram illustrating a relationship between the distance from the center of the substrate and a spectral line emission coefficient.

Next, on the assumption that the plasma was concentrically expanded, the above-described Lf(x) was used to calculate an emission coefficient ε(r) from the plasma at a distance of r from the center from the following Expression 2 on the basis of Abel transformation. Also, a result of the calculation is illustrated in FIG. 14.

$$\varepsilon(r) = -\frac{1}{\pi}\int_r^\infty \frac{L_f(x)-L_f(r)}{(x^2-r^2)^{3/2}} x dx \quad \text{Expression 2}$$

Also, an absolute number density of emission species is, as represented by the following Expression 3, proportional to the spectral line emission coefficient ε(r). In Expression 3 below, $N_2$ represents a number density of upper level molecules, ε the spectral line emission coefficient, hν a photon energy, and $A_{2n}$ a natural radiation coefficient.

$$N_2(r)=4\pi/(h\nu A_{2n})\times\varepsilon(r) \quad \text{Expression (3)}$$

The natural radiation coefficient and photon energy for some bright line spectrum are constant, and therefore by obtaining the number densities of molecules at the substrate positions of 0 mm (center of the substrate) and 42 mm (edge of the substrate), a ratio in emission coefficient was obtained as represented by the following Expression 4. It turns out from this that a CH radical density at (above) the edge of the substrate is 72% of that at the center of the substrate.

$$N_2(42)/N_2(0)=\varepsilon(42)/\varepsilon(0)=0.72 \quad \text{Expression 4}$$

Next, the film deposited under the conditions of the present example was evaluated.

First, the electron emission film 13 has: as schematically illustrated in FIG. 5, the carbon nanowall (CNW) 31 in which a plurality of curved petal-shaped (fan-like) carbon flakes having a graphite structure are connected in a random direction to one another with uprising; nanocrystalline diamond film (carbon film) 32 that is a layer containing a plurality of nanocrystalline diamond particles and continuously deposited on the CNW 31; and needle-like carbon rods 33 protruding from the surface of the nanocrystalline diamond film 32.

Figure 15:
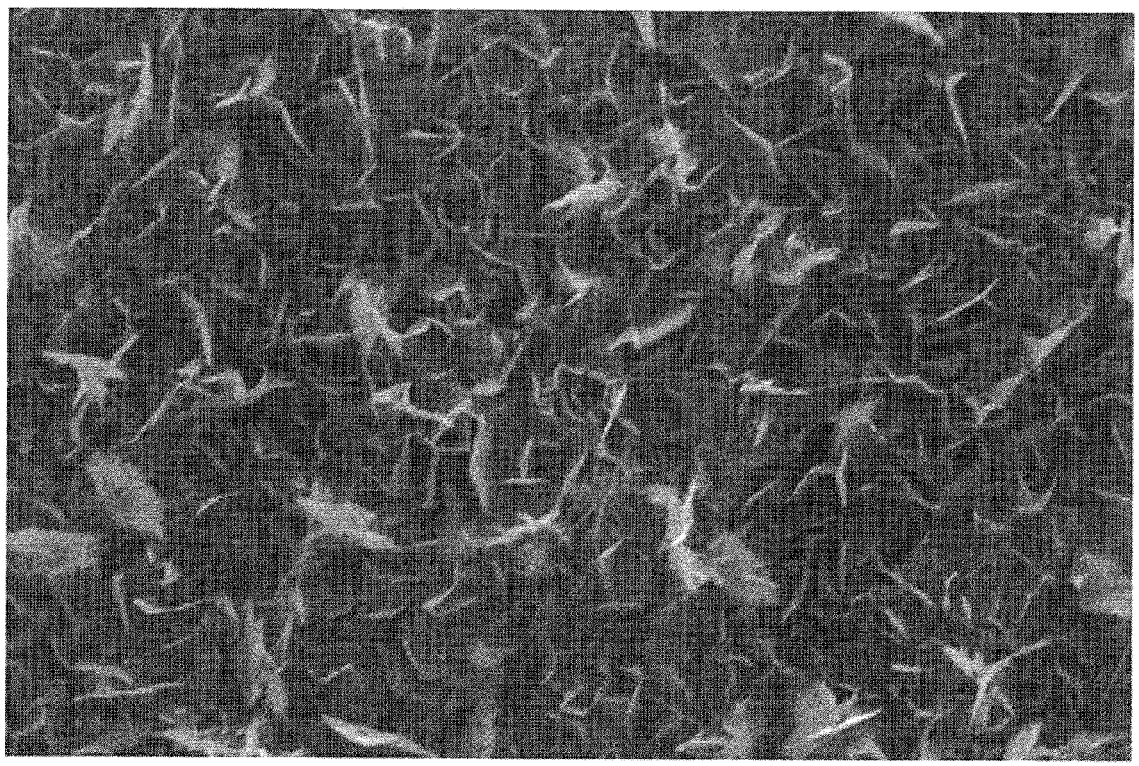
FIG. 15 is an image in which a surface of a carbon nanowall in the example of the present invention is scanned with a scanning electron microscope.
Figure 16:
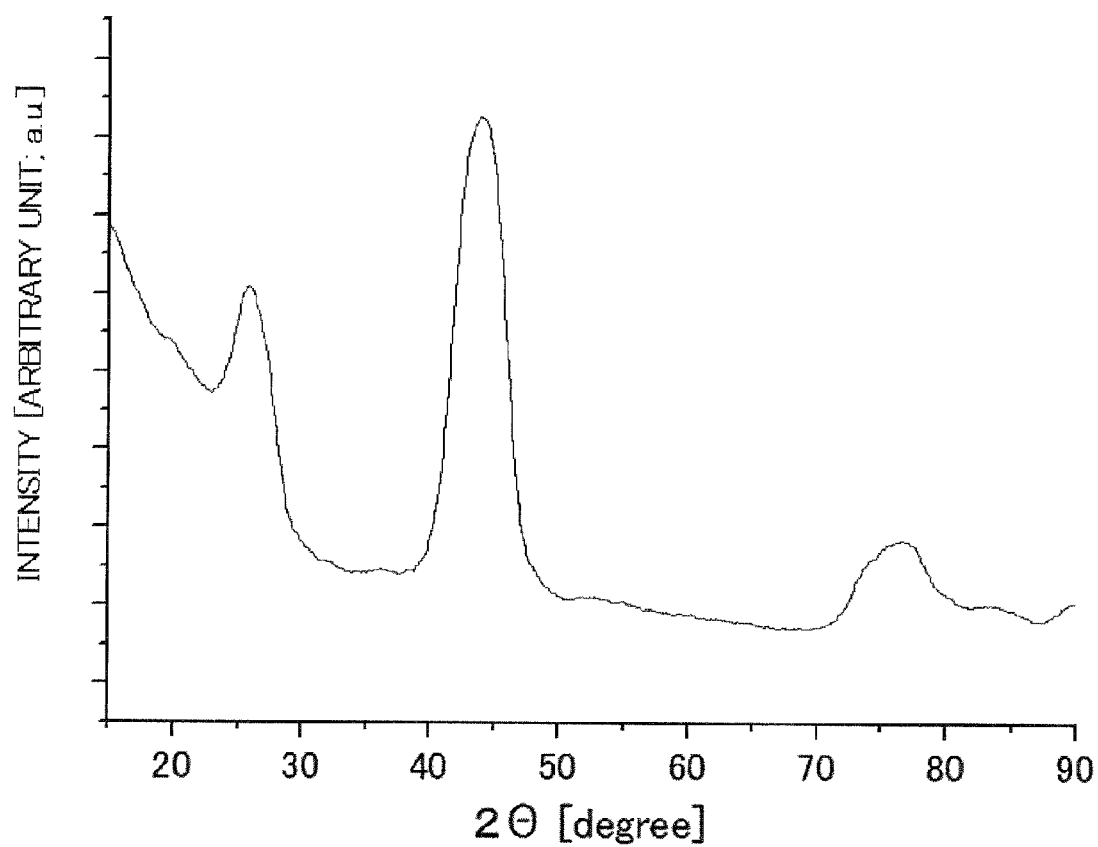
FIG. 16 is a diagram illustrating an X-ray diffraction pattern of the carbon nanowall in the example of the present invention.
Figure 17:
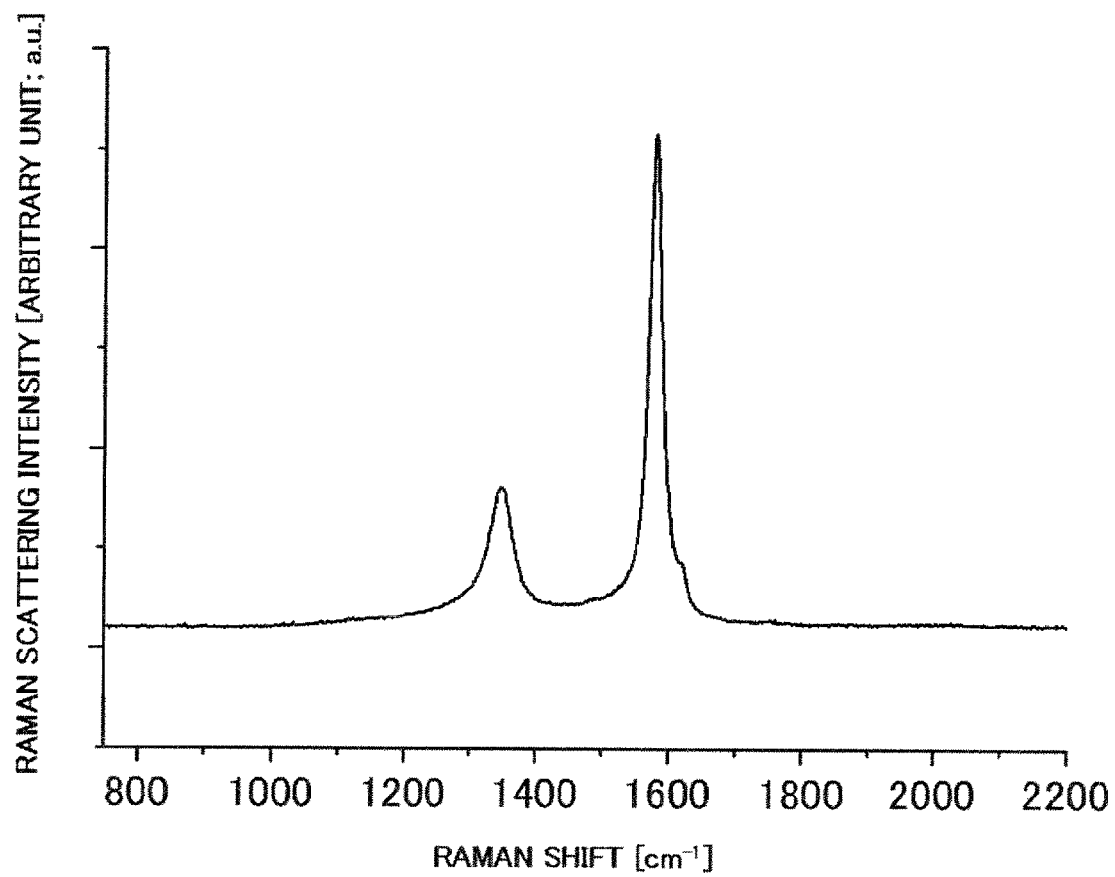
FIG. 17 is a diagram illustrating a Raman spectrum of the carbon nanowall in the example of the present invention.

An image of a surface of the CNW 31 (surface corresponding to an interface between the CNW 31 and the nanocrystalline diamond film illustrated in FIG. 5) before the deposition of the nanocrystalline diamond film 32, which is scanned by a scanning electron microscope, is shown in FIG. 15. Also, an X-ray diffraction pattern and laser beam based (wavelength=532 nm) Raman spectrum of the CNW are illustrated in FIGS. 16 and 17, respectively. As illustrated in FIG. 15, the CNW consists of the plurality of curved petal-shaped (fan-like) carbon flakes connected in a random direction to one another with uprising. The CNW has a thickness of 1 nm to 500 nm. Also, from the X-ray diffraction pattern illustrated in FIG. 16, a graphite plane is recognized. Further, from FIG. 17 illustrating the Raman spectrum, it turns out that the CNW has sp2 bonds. Still further, regarding the carbon flake of the CNW, one can see almost no peak other than a G-band peak at around 1580 cm⁻¹ which is due to vibration of carbon atoms in a hexagonal lattice based on a carbon-carbon bond of graphite and has a half width of less than 50 cm⁻¹, and a D-band peak at around 1350 cm⁻¹, which is observed in graphite involving a lattice defect, and therefore it can be that the carbon flake is formed of dense and high purity graphite having sp2 bonds. It turns out from this that each of the carbon flakes of the CNW contains a few layers to a few tens layers of graphene sheets having a lattice spacing of 0.34 nm. The graphene sheet has sp2 bonds, and exhibits electrical conductivity. Accordingly, the CNW exhibits electrical conductivity.

Also, as schematically illustrated in FIG. 5, the needle-like carbon rods 33 are grown from the CNW 31. Further, around the needle-like carbon rods 33, the diamond nanoparticles 32a of the nanocrystalline diamond film 32 are arranged. Because the needle-like carbon rods 33 are grown from the CNW 31 as described, the needle-like carbon rods 33 and the CNW 31 are continued, and therefore electrons are efficiently supplied from the electrically conductive (CNW 31 to the needle-like carbon rods 33, and well emitted from the needle-like carbon rods 33.

Figure 18:
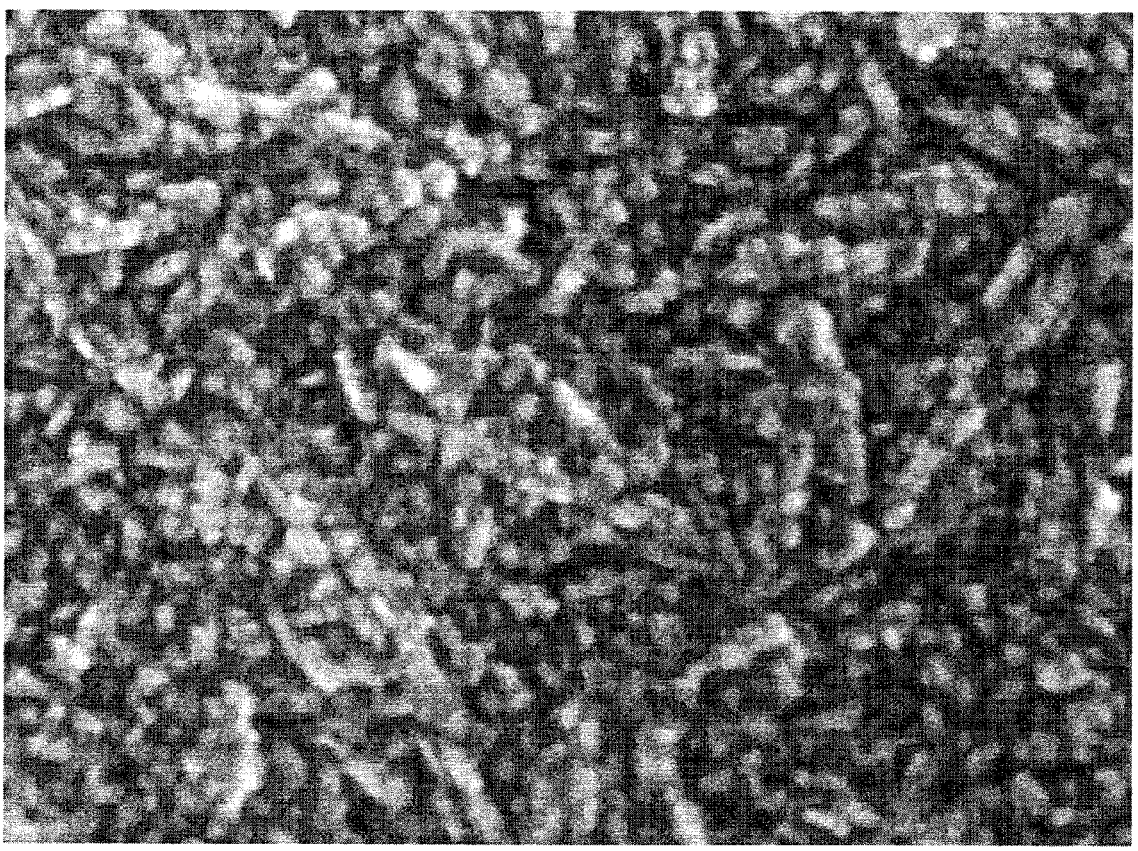
FIG. 18 is an image in which a surface of a nanodiamond film (carbon film) in the example of the present invention is scanned with the scanning electron microscope.
Figure 19:
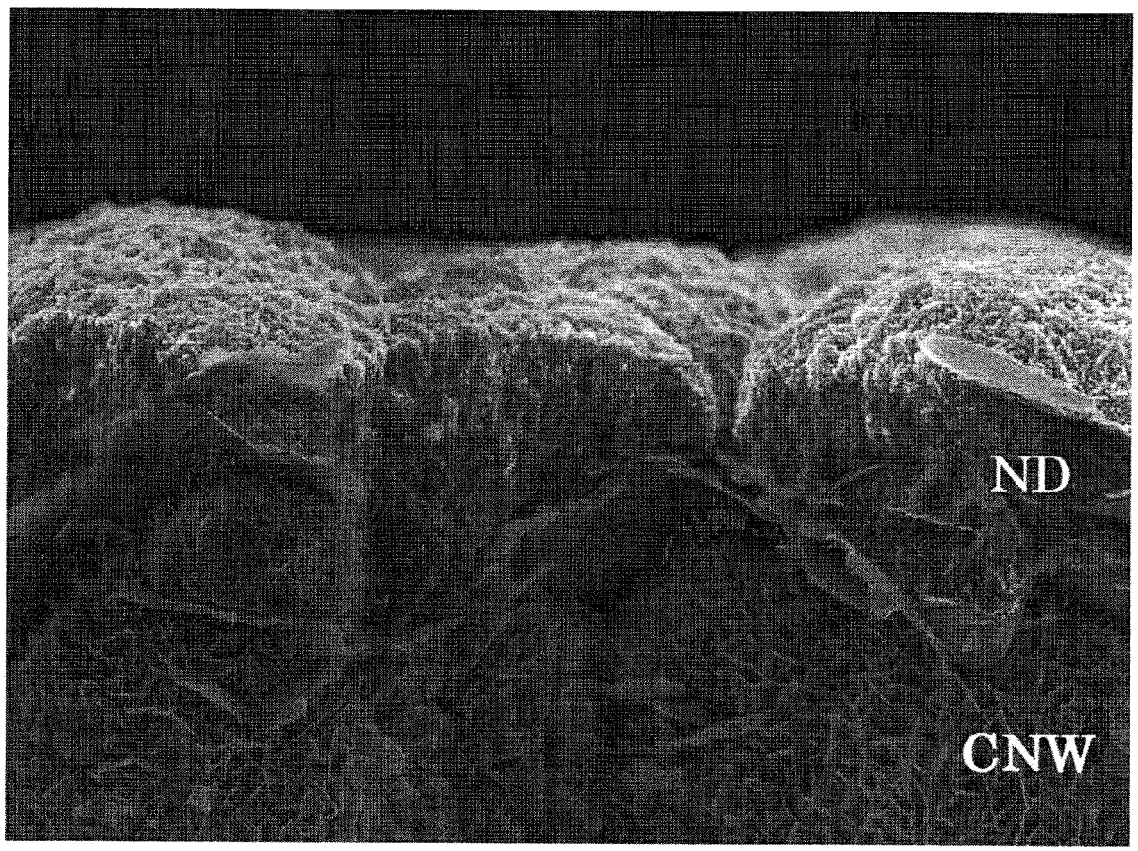
FIG. 19 is an image in which a cross section of the nanodiamond film (carbon film) in the example of the present invention is scanned with the scanning electron microscope.
Figure 20:
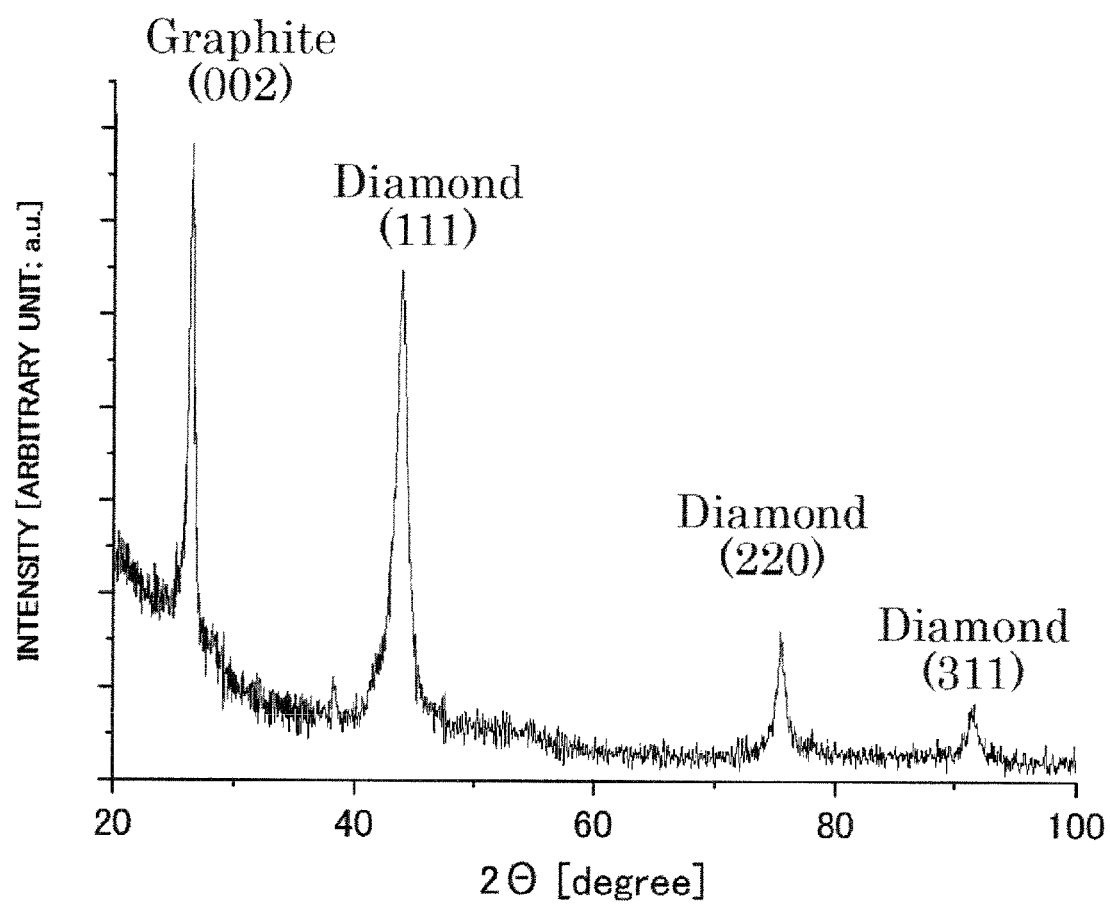
FIG. 20 is a diagram illustrating an X-ray diffraction pattern of the nanodiamond film in the example of the present invention.
Figure 21:
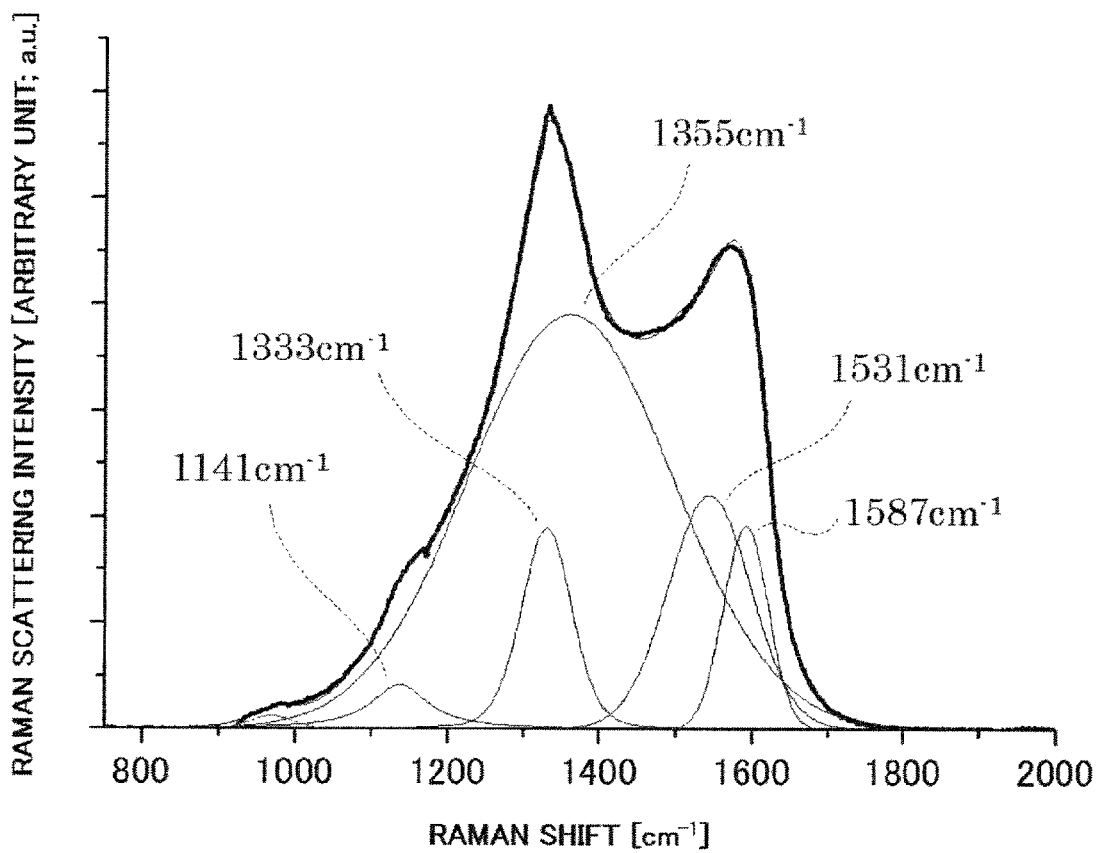
FIG. 21 is a diagram illustrating a Raman spectrum of the nanodiamond film in the example of the present invention.

Next, images of a surface of the nanocrystalline diamond film (carbon film), which is scanned from above by the scanning electron microscope, is shown in FIG. 18. An image of a cross-section of the nanocrystalline diamond film (carbon film), which is scanned by the scanning electron microscope, is shown in FIG. 19. Also, an X-ray diffraction pattern and laser beam based (wavelength=532 nm) Raman spectrum of the nanocrystalline diamond film formed on the CNW are illustrated in FIGS. 20 and 21, respectively. Note that, in the nanocrystalline diamond film, in addition to pure graphite and diamond particles, an intermediate phase having both sp2 and sp3 bonds is recognized, and the nanocrystalline diamond film has a complex of them, so that, to be exact, the nanocrystalline diamond film should be called a carbon film; however, in the present embodiment, for convenience of description, it is called the nanocrystalline diamond film.

The nanocrystalline diamond film is of a layered stricture containing the plurality of sp3-bonded diamond nanoparticles having a particle size of 5 to 10 nm, and on the surface thereof, a few tens to a few hundreds of diamond nanoparticles are aggregated as illustrated in FIG. 18 to form textures like a bamboo leaf. Also, in such nanocrystalline diamond film, a plurality of the bamboo leaves are aggregated on the surface as illustrated in FIGS. 18 and 19 to form a plurality of close packed aggregates having a substantially circular surface, which cover the CNW. It is preferable that a diameter of the aggregate in the nanocrystalline diamond film is approximately 1 to 5 μm, and the aggregates are grown to the extent of covering the CNW. The surface of the nanocrystalline diamond film is less uneven than that of the underlying CNW, and relatively smooth. Also, at interfaces (grain boundaries) between the respective aggregates in the nanocrystalline diamond film, gaps are formed as illustrated in the diagram. In the process of the nanocrystalline diamond film growth, the nanocrystalline diamond film 32 serves as a steric barrier to apply stress to the CNW attempting to grow under the film 32, and consequently parts of the CNW are grown in a needle-like shape to form the needle-like carbon rods protruding through the gaps. Accordingly, the nanocrystalline diamond film, and the gaps between the aggregates in the nanocrystalline diamond film have an effect of metamorphosing the CNW growth to form a large number of the needle-like carbon rods.

Referring to the X-ray diffraction pattern of the nanocrystalline diamond film, the nanocrystalline diamond film has significant peaks of crystalline diamond as illustrated in FIG. 20. Such sharp peaks cannot be observed in an amorphous phase such as diamond-like carbon, and therefore it is recognized that crystalline diamond is produced. Also, in the above-described X-ray diffraction pattern, a graphite peak was slightly observed in addition to the diamond peaks. It turns out from this that, on the main surface of the nanocrystalline diamond film, there exist not only diamond but also the needle-like carbon rods and after-mentioned graphite that has crystallinity, such as a phase including sp2 bonds are dominating, and that the surface of the nanocrystalline diamond film is not a complete insulator but exhibits electrical conductivity to the extent that the needle-like carbon rods can be conductive and is therefore excellent in electron emission characteristics.

FIG. 21 illustrates a result of the laser beam based (wavelength=532 nm) Raman spectroscopy. A spectrum indicated by a solid line is one in which a portion in the range of 750 to 2000 $cm^{-1}$ is extracted from a Raman spectrum of the aggregates of the plurality of diamond nanoparticles in the nanocrystalline diamond film and the phase dominated by the sp2 bonds, and from the extracted spectrum, numerical values of a baseline defined as a line connecting between edges of the extracted spectrum are removed.

Then, pseudo-Voigt type functions using 1140, 1330, 1333, 1520, and 1580 $cm^{-1}$ as position initial values were used and fitted such that, on the basis of a nonlinear least square method in which respective peak positions, heights, and line widths have degrees of freedom, a profile superposed with the respective peaks is fitted to the actual measured spectrum. As a result, as illustrated in FIG. 21, a profile almost corresponding to the actual measured spectrum was obtained.

In the diagram, a signal around 1140 $cm^{-1}$ is observed, which was not observed in the CNW signal. This is a peak observed in diamond synthesized by CVD or the like, and considered as a peak derived from a phase that has a structure close to sp3 in terms of a C—C bond angle and bond length, and a crystalline (or cluster) size of the order of nanometers. Also, FIG. 21 suggests that a peak exists at 1333 $cm^{-1}$, which is hidden by a graphite D-band peak (1355 $cm^{-1}$) having a large line width. This is considered as a peak derived from diamond only having 1/20 or less sensitivity as compared with graphite in the visible light based Raman spectroscopic measurement. From these, it is considered that the Raman spectrum in FIG. 21 is derived from the ND layer that substantially consists of crystalline diamond nanoparticles dominated by a diamond composition.

Figures 22A, 22B:
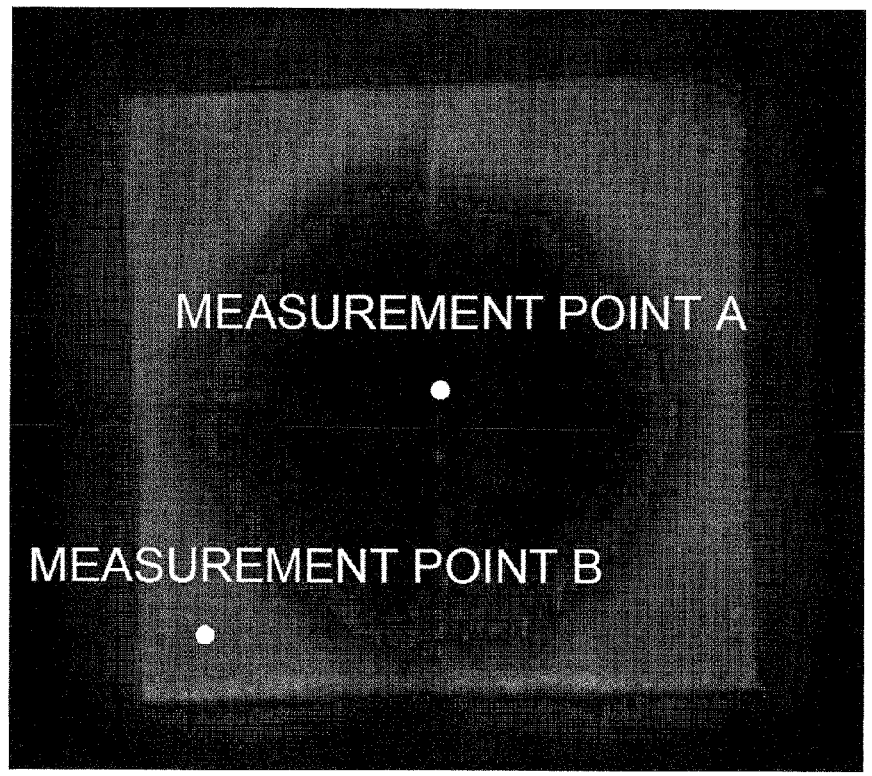
FIG. 22A is a table showing temperatures at the measurement points A and B upon completion of deposition of the ND film for the case where the heat flow control heat transfer part is omitted.
FIG. 22B is a photograph showing electron emission of a field emission type electrode deposited with the heat flow control heat transfer part being omitted.
Figure 23A:
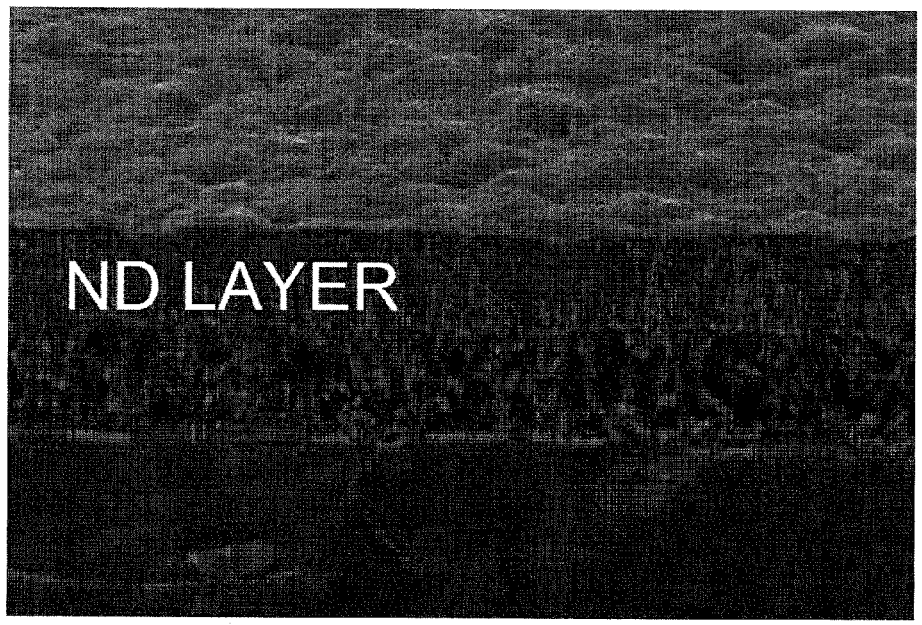
FIG. 23A is a photograph showing a cross section of the field emission type electrode at the measurement point A, which is deposited with the heat flow control heat transfer part being omitted.
Figure 23B:
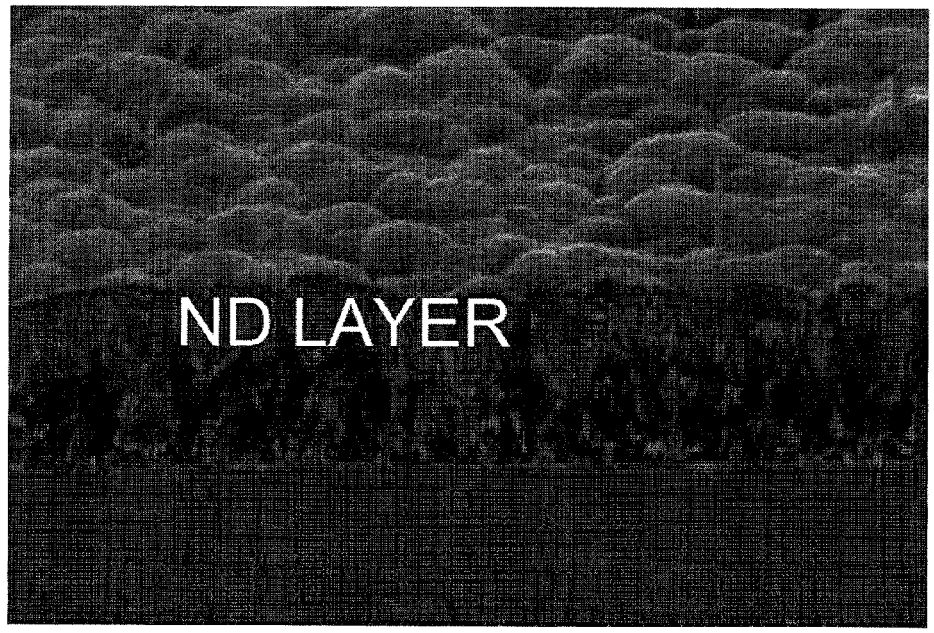
FIG. 23B is a photograph showing a cross section of the field emission type electrode at the measurement point B, which is deposited with the heat flow control heat transfer part being omitted.

Next, FIG. 22A illustrates a table showing temperatures at the measurement points A and B upon completion of deposition of the ND film for a case where the CNW and ND film were deposited without use of the heat flow control heat transfer part under the above-described conditions as a comparative example. Also, FIG. 22B provides an image in which between the field emission type electrode deposited with the ND film under the above-described comparative example conditions omitting the heat flow control heat transfer part and a fluorescent plate, voltage is applied to emit electrons, and light emission from the fluorescent plate due to electron irradiation is observed. Also, FIGS. 23A and 23B provide SEM (Scanning Electron Microscope) photographs of cross sections at the measurement points A and B of FIG. 22B, respectively. Note that, in FIG. 22B, the voltage applied between the electron emission film and the fluorescent plate was pulsed voltage, and as conditions of the application, a distance between the electrodes was set to 4.4 mm, peak voltage to 5 kV, repetition rate to 500 Hz, and duty ratio to 0.5%.

As illustrated in FIG. 22A, in the case where the deposition is performed without application of the heat flow control heat transfer part the temperatures at the measurement points A and B upon completion of the deposition are 980° C. and 963° C., respectively. That is, a temperature difference between the center of the substrate and the corner area of the substrate is 17° C. Also, a temperature gradient between measurement points A and B on the substrate was 7° C./cm. As illustrated in FIG. 22B, in the central area, electrons are not emitted, and therefore uniform characteristics in electron emission are not obtained. Also, as illustrated in FIGS. 23A and 233B, it turned out that surface unevenness at the measurement point A was reduced as compared with that at the measurement point B. Further, as a result of a measurement using a probe-type surface roughness meter, a surface roughness at the measurement point A was 43 nmRa. Still further, gold (Au) was evaporated in a circular shape having a diameter of 5 mm onto the measurement point on the film surface as an electrode, followed by an electrical resistivity measurement based on a two-terminal method, and consequently an electrical resistivity at the measurement point A was 7 kΩm. Note that the electrical resistivity was calculated from a thickness of the ND film and an area of electrode on the assumption that electrical resistances of the substrate and CNW, were negligibly small relative to that of the ND film. Also, as results of the similar measurements, a surface roughness and electrical resistivity at the measurement point B were 91 nmRa and 4 kΩcm, respectively. As described, a difference of approximately 50 nmRa is present in surface roughness, and also a difference of approximately 3 kΩcm is present in electrical resistivity. It is also obvious that the electron emission observed from the fluorescence is hardly observed in the central area of the electrode, and electrons are well emitted in the peripheral area of the electrode. As described above, it turns out that, in the configuration without use of the heat flow control heat transfer part, there is a large difference in electrical characteristics between the measurement points A and B.

Figures 24A, 24B:
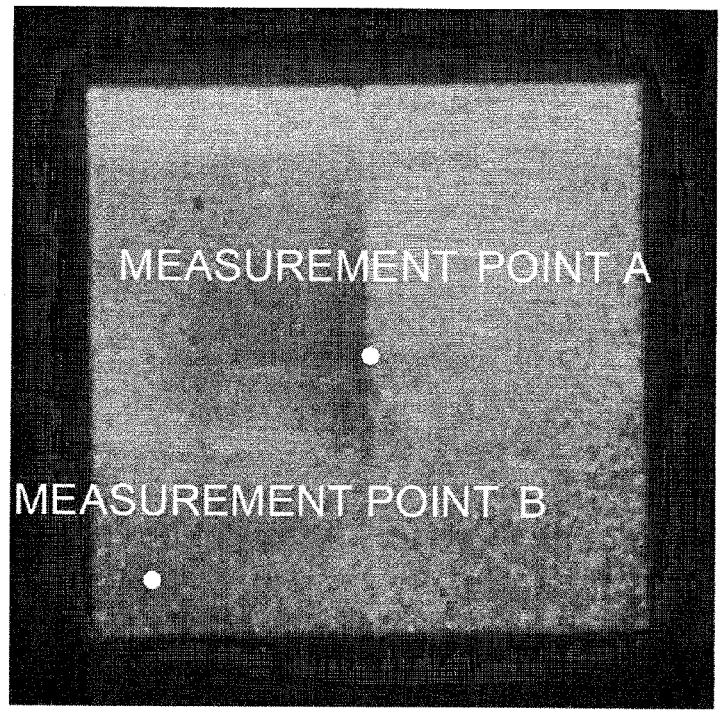
FIG. 24A is a table showing temperatures at the measurement points A and B upon completion of deposition of the ND film in the example of the present invention.
FIG. 24B is a photograph showing electron emission of a field emission type electrode in the embodiment of the present invention.
Figure 25A:
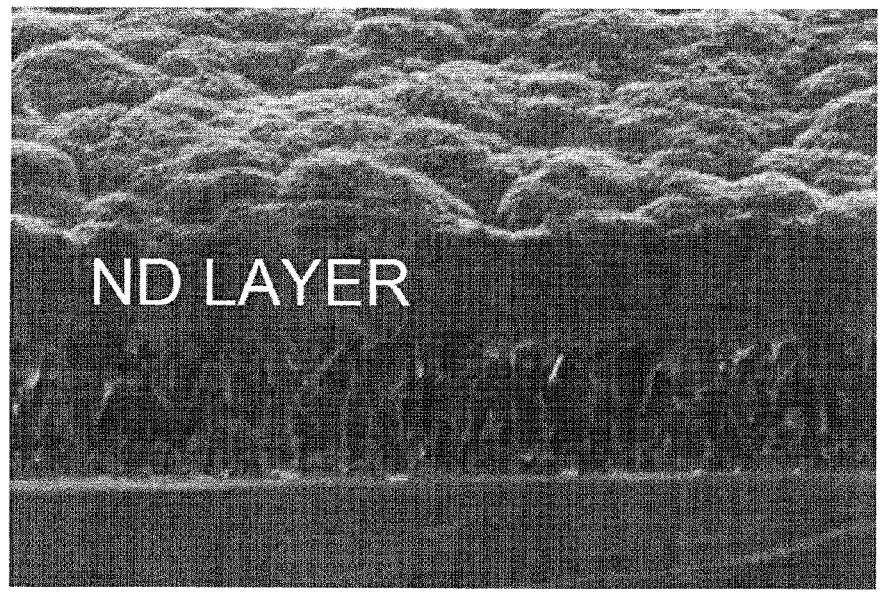
FIG. 25A is a photograph showing a cross section of the field emission type electrode at the measurement point A in the embodiment of the present invention.
Figure 25B:
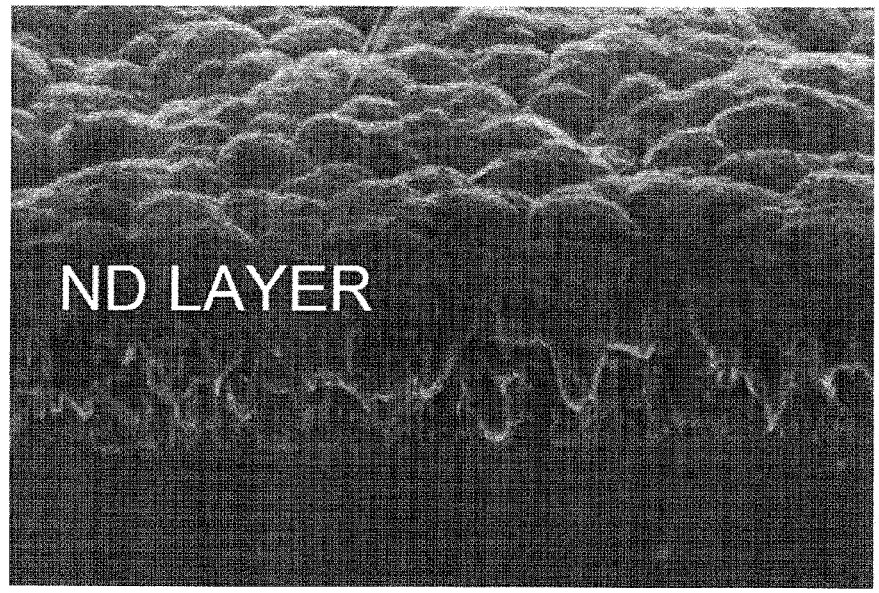
FIG. 25B is a photograph showing a cross section of the field emission type electrode at the measurement point B in the embodiment of the present invention.

On the other hand, temperatures at the measurement points A and B upon completion of deposition of the ND film for the case where the CNW and ND film were deposited with use of the heat flow control heat transfer part according to the embodiment of the present invention under the above-described conditions are shown in FIG. 24A. Also, electron emission of the field emission type electrode deposited with the CNW and ND film under the above-described conditions is illustrated in FIG. 24B. FIGS. 25A and 25B are SEM photographs of cross sections at the measurement points A and B in FIG. 24B, respectively. A position of the measurement point A illustrated in FIG. 24B corresponds to that of the measurement point A illustrated in FIG. 22B, and is a position that is overlapped with the center of the substrate 11 illustrated in FIG. 2, i.e., the central region of the positive column during the deposition, and not overlapped with the heat flow control heat transfer part 110. A position of the measurement point B illustrated in FIG. 24B corresponds to that of the measurement point B illustrated in FIG. 22B, and is a position that corresponds to the corner area 11a of the substrate 11 illustrated in FIG. 2 and is overlapped with the peripheral region of the positive column during the deposition and heat flow control heat transfer part 110. As is clear from FIGS. 25A and 25B, in the case of using the heat flow control heat transfer part of the present embodiment, the temperatures at the measurement points A and B upon completion of the deposition were 980° C. and 952° C. respectively. That is, a temperature difference between the center and edge of the substrate was 28° C., and a temperature gradient between the measurement points A and B was 12° C./cm. As described above, in the configuration omitting the heat flow control heat transfer part, the temperature difference between the points A and B was 17° C.; however, by providing the heat flow control heat transfer part, the additional temperature difference of 10° C. could be produced.

Also, as illustrated in FIG. 24B, it turns out that, in the configuration provided with the heat flow control heat transfer part, electrons are almost uniformly emitted even in the central area, and even from the perspective of the entire electrode, electrons are almost uniformly emitted. Further, as illustrated in FIGS. 25A and 25B, it turned out that surface unevenness at the measurement point A was less as compared with that at the measurement point B; however, the difference between them was small as compared with that in the configuration omitting the heat flow control heat transfer part. Still further, surface roughnesses and electrical resistivities were measured in the same manner as in the configuration omitting the heat flow control heat transfer part, and consequently the surface roughness at the measurement point A was 81 nmRa, and the electrical resistivity at the measurement point A was 4 kΩcm. Also, the surface roughness and electrical resistivity at the measurement point B were 111 nmRa and 4 kΩcm, respectively. As described, it turned out that by providing the heat flow control heat transfer part as in the present embodiment, electrons could be almost uniformly emitted of the measurement points A and B, and the electrical resistivities of them could be made almost the same. As described above, by using the heat flow control heat transfer part in the configuration of the present embodiment, the film having relatively uniform electrical characteristics within the substrate surface can be deposited.

Also, in view of the CH distribution state as illustrated in FIG. 14, it was observed that, in a distribution of the active species (CH) in the conditions of the present example, there was not a significant difference in density of the active species within a range of 5 mm from the center of the substrate, and the density was decreased in a range exceeding 5 mm. It is considered that, in the present example, the density of the active species at 43 mm corresponding to the tip of the corner area of the substrate was approximately 73% of that in the central area, and therefore by providing the temperature gradient within the substrate, the more uniform deposition could be performed.

The present invention is not limited to the above-described embodiment, but may be variously modified.

The description is given by taking as an example the configuration in which the heat flow control heat transfer part is installed between the anode and the placing stage; however, without limitation to this, it may be installed between the substrate and the anode.

Figure 26:
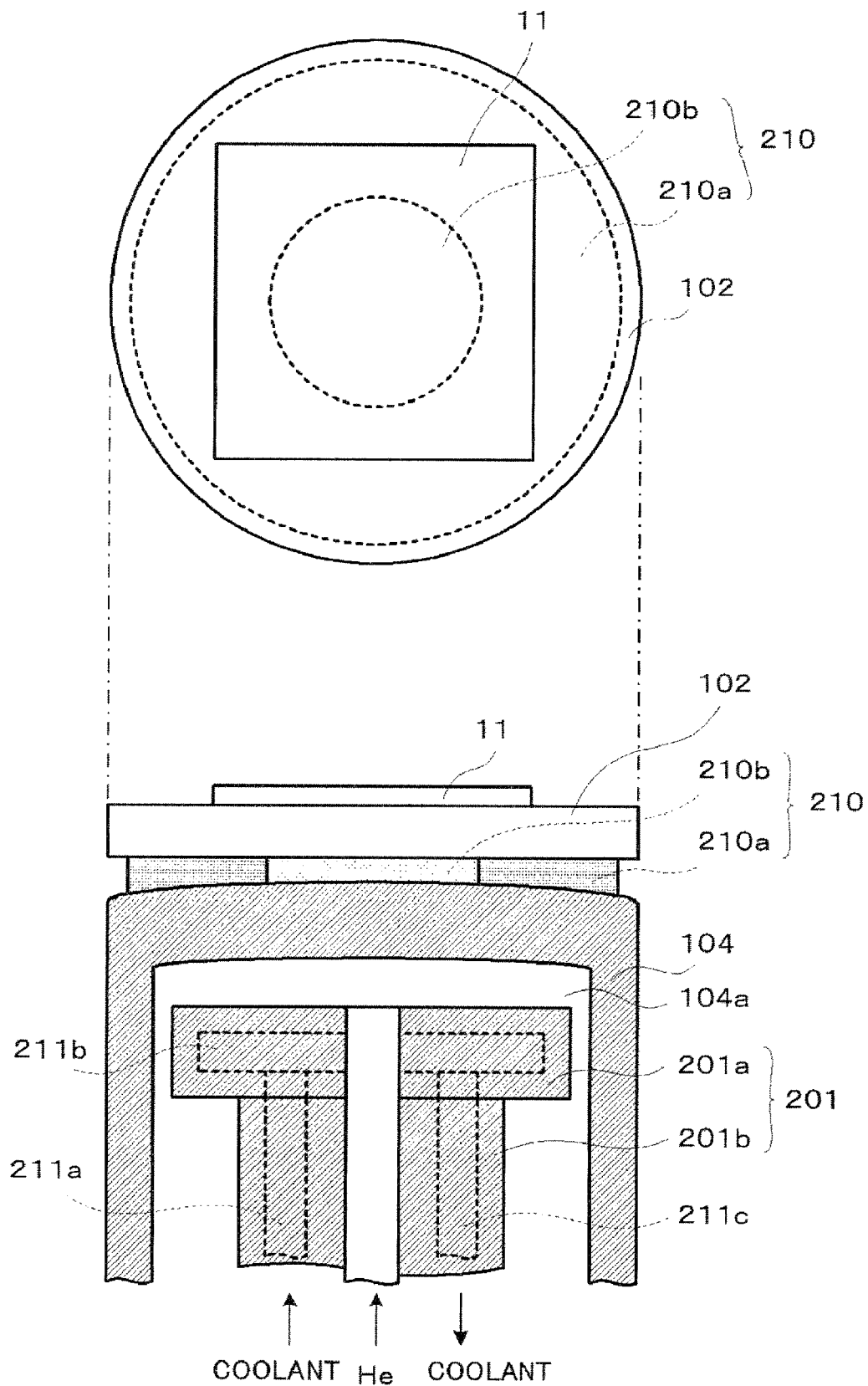
FIG. 26 is a diagram illustrating a variation of the present invention.

In the above-described embodiment, the case where the heat flow control heat transfer part 110 is formed in a hollow ring-like shape is taken as an example, but the heat flow control heat transfer part 110 is not limited to this. For example as illustrated in FIG. 26, the heat flow control heat transfer part 210 may be formed in a disk-like shape in which a central area 210b to be the area where the density of the active species contributing to the deposition is high is formed of a material having low thermal conductivity, such as Al$_2$O$_3$, whereas a peripheral area 210a to be the area where the density of the active species contributing to the deposition is low are formed of a material having higher thermal conductivity than that of the central area 210b, such as Cu. The thermal conductivity of Al$_2$O$_3$ is 20 W/(m·K), and that of Cu is 350 W/(m·K), so that more heat is transferred to the placing stage from the peripheral area formed of Cu. Similarly to the above-described embodiment, this enables heat flows from the center to the direction of the peripheral area of the substrate to be generated, resulting in a temperature gradient within the substrate. Note that, besides the two types of materials, three or more types of materials may be combined to generate the heat flows from the center to the peripheral area of the substrate, resulting in a temperature gradient within the substrate. In this case, the peripheral area 210a and the central area 210b may be separated from each other.

Figure 27:
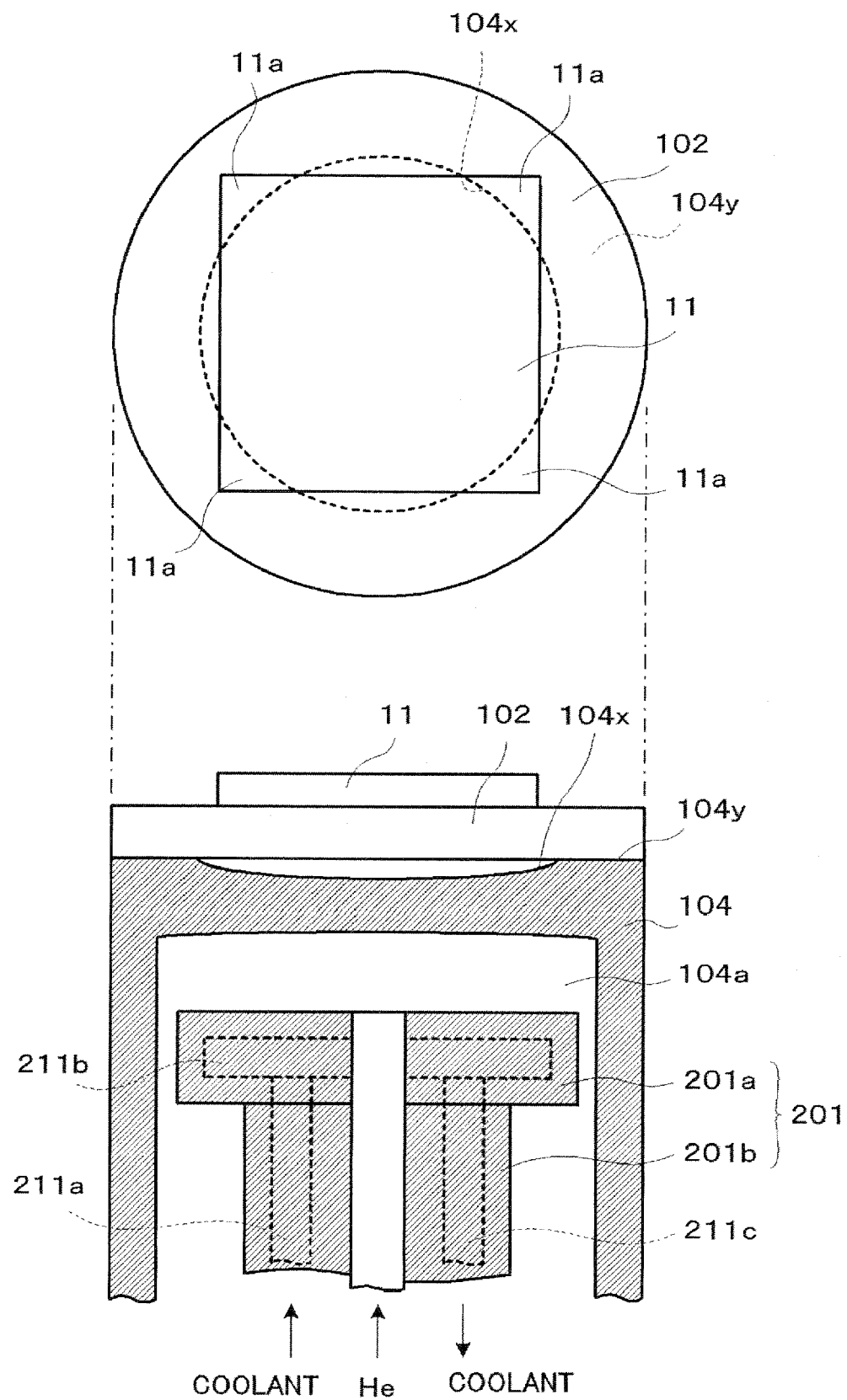
FIG. 27 is a diagram illustrating a variation of the present invention.

Also, as illustrated in FIG. 27, the stage 104 may have: a concave portion 104x of which a central part is concaved; and a heat flow control heat transfer part 104y protruding so as to surround the concave portion 104x. The heat flow control heat transfer part 104y is ring-shaped, and overlapped with the corner areas 11a. A backside of the anode 102 corresponding to the central area of the substrate 11 where the density of the active species contributing to the formation of the ND film is high is opposed to the concave portion 104x, and has a space with the concave portion 104x, so that thermal resistance between the central area of the substrate 11 and the concave portion 104x is high. On the other hand, a backside of the anode 102 corresponding to the corner areas 11a of the substrate where the density of the active species contributing to the formation of the ND film is low is in contact with the heat flow control heat transfer part 104y of the stage 104, so that thermal resistance between the corner areas 11a of the substrate 11 and the heat flow control heat transfer part 104y is low. As described, even by making a part of the stage 104 to serve as the heat flow control heat transfer part 104y, a similar effect can be obtained.

Also, the substrate 11 may include at least any one of rare earthes, copper, silver, gold, platinum, and aluminum other than nickel.

Further, a mixing ratio of the source gases, i.e., hydrogen gas and carbon-containing compound, may be appropriately selectively changed.

Still further, in the above-described embodiment, the electron emission type electrode is formed; however, the present invention may also be applied to a case where the other electronic element is formed by continuous plasma CVD, and is effective for the case where composite films having different film properties are continuously formed, or the other case.

In addition, if cooling capability of the cooling gas can be sufficiently ensured, preferably, the anode 102 is cooled by, rather than completely bringing the entire flat plate part 201a of the cooling part 201 into abutting contact with the stage 104, bringing a part of the flat plate part 201a of the cooling part 201 into abutting contact with the stage 104 so that the rest of the flat plate part 201a is close to but apart from it, or bringing the entire flat plate part 201a close to it to the extent that the entire flat plate part 201a is not in abutting contact with it.

Also, in the above-described embodiment, the heat flow control heat transfer part is of a circular ring-shape because the substrate surface in contact with the positive column is circular; however, if a shape of the positive column is one other than the circular shape, the heat flow control heat transfer part may be fitted to the shape of the positive column. In this case, the heat flow control heat transfer part may be of a hollow ring-like shape, and the inner and outer portions may be formed of materials having low and high thermal conductivities, respectively.

Various embodiments and changes may be made thereunto without departing from the broad spirit and scope of the invention. The above-described embodiments are intended to illustrate the present invention, not to limit the scope of the present invention The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2007-325303 filed on Dec. 17, 2007 and including specification, claims, drawings and summary. The disclosure of the above Japanese Patent Application is incorporated herein by reference in its entirety.

What is claimed is:

1. A deposition method comprising:
providing a heat flow control heat transfer part that is located between a placing stage on which a first electrode is placed and the first electrode, or that comprises a part of the placing stage;
placing a processing object on the first electrode;
generating plasma between the first electrode and a second electrode to generate active species that contribute to deposition of a film, wherein a density of the active species is lower at a peripheral area of the processing object than at a central area of the processing object;
depositing a film on the processing object; and
during the depositing, creating a differential between (i) a thermal resistance between the central area of the processing object and the placing stage and (ii) a thermal resistance between the peripheral area of the processing object and the placing stage, such that a heat flow is caused from the central area of the processing object toward the peripheral area of the processing object;
wherein the differential is created by the heat flow control heat transfer part, which is opposed to at least one part of the peripheral area of the processing object.

2. The deposition method according to claim 1, wherein the heat flow control heat transfer part is opposed to the at least one part of the peripheral area of the processing object via the first electrode.

3. The deposition method according to claim 1, wherein the heat flow control heat transfer part has a hollow ring-like shape.

4. The deposition method according to claim 1, wherein the heat flow control heat transfer part comprises:
a first area comprising a material having a first thermal conductivity; and
a second area comprising a material having a second thermal conductivity that is higher than the first thermal conductivity;
wherein the first area is provided in a central area of the heat flow control heat transfer part; and
wherein the second area is provided in a peripheral area of the heat flow control heat transfer part.

5. The deposition method according to claim 4, wherein the heat flow control heat transfer part has a disk-like shape.

6. The deposition method according to claim 1, wherein the heat flow control heat transfer part cools the processing object via the first electrode by being cooled by a cooling system for cooling the placing stage, wherein the placing stage intervenes between the cooling system and the first electrode.

7. The deposition method according to claim 1, wherein in the deposition, a nanocrystalline diamond film is formed on the processing object.

8. The deposition method according to claim 7, wherein a carbon nanowall comprising a graphene sheet is formed under the nanocrystalline diamond film.

9. The deposition method according to claim 8, wherein a protrusion comprising graphite is formed so as to protrude from the nanocrystalline diamond film.

10. The deposition method according to claim 1, further comprising measuring a temperature of the processing object.

11. The deposition method according to claim 1, wherein the heat flow control heat transfer part includes molybdenum.

12. A deposition method for depositing a film, wherein plasma is generated between a first electrode for placing a processing object and a second electrode, the method comprising:
creating a differential between (i) a thermal resistance between a central area of the processing object and a placing stage on which the first electrode is placed (ii) a thermal resistance between a peripheral area of the processing object and the placing stage, by a heat flow control heat transfer part, such that a heat flow is caused from the central area of the processing object toward the peripheral area of the processing object; and
depositing a film on the processing object by generating plasma between the first electrode and the second electrode in a state in which the heat flow from the central area of the processing object toward the peripheral area of the processing object is caused;
wherein the heat flow control heat transfer part comprises a first region which corresponds to the central area of the processing object and is formed of a first material having a first heat transfer efficiency, and a second region which corresponds to the peripheral area of the processing object and comprises a material having a second heat transfer efficiency that is higher than the first heat transfer efficiency; and
wherein a density of active species that contribute to the deposition of the film and that are generated by the plasma is higher at the central area of the processing object than at the peripheral area of the processing object.

* * * * *